(12) United States Patent
Rinne

(10) Patent No.: US 7,674,701 B2
(45) Date of Patent: Mar. 9, 2010

(54) METHODS OF FORMING METAL LAYERS USING MULTI-LAYER LIFT-OFF PATTERNS

(75) Inventor: Glenn A. Rinne, Apex, NC (US)

(73) Assignee: Amkor Technology, Inc., Chandler, AZ (US)

( * ) Notice: Subject to any disclaimer, the term of this patent is extended or adjusted under 35 U.S.C. 154(b) by 549 days.

(21) Appl. No.: 11/671,018

(22) Filed: Feb. 5, 2007

(65) Prior Publication Data
US 2007/0184643 A1    Aug. 9, 2007

Related U.S. Application Data

(60) Provisional application No. 60/771,420, filed on Feb. 8, 2006.

(51) Int. Cl.
*H01L 21/44* (2006.01)
(52) U.S. Cl. .............. 438/612; 438/614; 438/613; 438/617
(58) Field of Classification Search .......... 438/612, 438/613–617, 83, 98, 100, 670, 671
See application file for complete search history.

(56) References Cited

U.S. PATENT DOCUMENTS

| | | | |
|---|---|---|---|
| 3,105,869 A | 10/1963 | Branch et al. | |
| 3,244,947 A | 4/1966 | Slater | |
| 3,259,814 A | 7/1966 | Green | |
| 3,274,458 A | 9/1966 | Boyer et al. | |
| 3,316,465 A | 4/1967 | von Bermuth et al. | |
| 3,458,925 A | 8/1969 | Napier et al. | |
| 3,461,357 A | 8/1969 | Mutter et al. | |

(Continued)

FOREIGN PATENT DOCUMENTS

CN    1269607    1/2002

(Continued)

OTHER PUBLICATIONS

Howell et al: "Area Array Solder Interconnection Technology for the Three-Dimensional Silicon Cube", Proceedings of the 1995 45$^{th}$ Electronic Components & Technology Conference, pp. 1174-1178.

(Continued)

*Primary Examiner*—Chuong A. Luu
(74) *Attorney, Agent, or Firm*—Myers Bigel Sibley & Sajovec, P.A.

(57) ABSTRACT

Methods of forming interconnections for an electronic device including a substrate may be provided. For example, first and second patterned layers may be formed on the substrate wherein an opening in the first and second patterned layers exposes portions of the substrate, wherein the first and second patterned layers have different compositions, and wherein the first patterned layer is between the second patterned layer and the substrate. A metal layer may be formed on the second patterned layer and on portions of the substrate exposed through the opening in the first and second patterned layers. The second patterned layer and portions of the metal layer thereon may be removed while maintaining portions of the metal layer on the portions of the substrate exposed through the opening. After removing the second mask layer, solder may be provided on the metal layer.

30 Claims, 18 Drawing Sheets

U.S. PATENT DOCUMENTS

| | | |
|---|---|---|
| 3,489,965 A | 1/1970 | Helsdon |
| 3,501,681 A | 3/1970 | Weir |
| 3,663,184 A | 5/1972 | Wood et al. |
| 3,760,238 A | 9/1973 | Hamer et al. |
| 3,770,874 A | 11/1973 | Krieger et al. |
| 3,871,014 A | 3/1975 | King et al. |
| 3,871,015 A | 3/1975 | Lin et al. |
| 3,897,871 A | 8/1975 | Zimnbauer |
| 3,916,080 A | 10/1975 | Wakamatsu |
| 3,934,057 A | 1/1976 | Moreau et al. |
| 3,942,187 A | 3/1976 | Gelsing et al. |
| 3,959,577 A | 5/1976 | Frink |
| 3,986,255 A | 10/1976 | Mandal |
| 3,993,123 A | 11/1976 | Chu et al. |
| 4,024,293 A | 5/1977 | Hatzakis |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,180,604 A | 12/1979 | Feng et al. |
| 4,204,009 A | 5/1980 | Feng et al. |
| 4,238,559 A | 12/1980 | Feng et al. |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,349,620 A | 9/1982 | Cyr et al. |
| 4,382,517 A | 5/1983 | Welsch |
| 4,449,580 A | 5/1984 | Reisman et al. |
| 4,473,263 A | 9/1984 | Sunstein |
| 4,511,873 A | 4/1985 | Baier et al. |
| 4,532,576 A | 7/1985 | Reimer |
| 4,545,610 A | 10/1985 | Lakritz et al. |
| 4,560,580 A | 12/1985 | Needham et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,687,693 A | 8/1987 | Sheyon et al. |
| 4,733,813 A | 3/1988 | Le Meau et al. |
| 4,752,027 A | 6/1988 | Oschwend |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | Lo Vasco et al. |
| 4,893,403 A | 1/1990 | Heflinger et al. |
| 4,897,508 A | 1/1990 | Mahulikar et al. |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 5,006,488 A | 4/1991 | Previti-Kelly |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,083,191 A | 1/1992 | Ueda |
| 5,113,314 A | 5/1992 | Wheeler et al. |
| 5,134,056 A | 7/1992 | Schmidt et al. |
| 5,135,155 A | 8/1992 | Kang et al. |
| 5,148,266 A | 9/1992 | Khandros et al. |
| 5,152,451 A | 10/1992 | Derveaux et al. |
| 5,154,341 A | 10/1992 | Melton et al. |
| 5,158,818 A | 10/1992 | Aurichio |
| 5,160,409 A | 11/1992 | Moore et al. |
| 5,162,257 A | 11/1992 | Yung |
| 5,194,137 A | 3/1993 | Moore et al. |
| 5,216,280 A | 6/1993 | Tanaka et al. |
| 5,227,664 A | 7/1993 | Toshio |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,258,330 A | 11/1993 | Khandros et al. |
| 5,276,350 A | 1/1994 | Merrill et al. |
| 5,289,925 A | 3/1994 | Newmark |
| 5,293,006 A | 3/1994 | Yung |
| 5,294,812 A | 3/1994 | Hashimoto et al. |
| 5,325,265 A | 6/1994 | Turlik et al. |
| 5,327,013 A | 7/1994 | Moore et al. |
| 5,327,327 A | 7/1994 | Frew et al. |
| 5,335,795 A | 8/1994 | Chizen |
| 5,347,428 A | 9/1994 | Carson et al. |
| 5,354,711 A | 10/1994 | Heitzmann et al. |
| 5,356,949 A | 10/1994 | Komiyama et al. |
| 5,381,946 A | 1/1995 | Koopman et al. |
| 5,391,514 A | 2/1995 | Gall et al. |
| 5,406,701 A | 4/1995 | Pepe et al. |
| 5,409,862 A | 4/1995 | Wada et al. |
| 5,424,920 A | 6/1995 | Miyake |
| 5,432,729 A | 7/1995 | Carson et al. |
| 5,453,582 A | 9/1995 | Amano et al. |
| 5,470,787 A | 11/1995 | Greer |
| 5,475,280 A | 12/1995 | Jones et al. |
| 5,492,235 A | 2/1996 | Crafts et al. |
| 5,504,374 A | 4/1996 | Oliver et al. |
| 5,536,970 A | 7/1996 | Higashi et al. |
| 5,547,740 A | 8/1996 | Higdon et al. |
| 5,557,502 A | 9/1996 | Banerjee et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,767,010 A | 6/1998 | Mis et al. |
| 5,773,359 A | 6/1998 | Mitchell et al. |
| 5,789,809 A | 8/1998 | Joshi |
| 5,793,116 A | 8/1998 | Rinne et al. |
| 5,812,378 A | 9/1998 | Fielstad et al. |
| 5,851,911 A | 12/1998 | Farnworth |
| 5,882,956 A | 3/1999 | Umchara et al. |
| 5,886,393 A | 3/1999 | Merrill et al. |
| 5,892,179 A | 4/1999 | Rinne et al. |
| 5,892,288 A | 4/1999 | Muraki et al. |
| 5,898,574 A | 4/1999 | Tan et al. |
| 5,902,686 A | 5/1999 | Mis |
| 5,914,501 A | 6/1999 | Antle et al. |
| 5,923,539 A | 7/1999 | Matsui et al. |
| 5,925,936 A | 7/1999 | Yamaji |
| 5,937,320 A | 8/1999 | Andricacos et al. |
| 5,963,793 A | 10/1999 | Rinne et al. |
| 5,990,472 A | 11/1999 | Rinne |
| 6,007,920 A | 12/1999 | Umchara et al. |
| 6,023,094 A | 2/2000 | Kao et al. |
| 6,034,437 A | 3/2000 | Shibata |
| 6,117,299 A | 9/2000 | Rinne et al. |
| 6,133,065 A | 10/2000 | Akram |
| 6,134,120 A | 10/2000 | Baldwin |
| 6,162,652 A | 12/2000 | Dass et al. |
| 6,169,325 B1 | 1/2001 | Azuma |
| 6,175,162 B1 | 1/2001 | Kao et al. |
| 6,208,018 B1 | 3/2001 | Ma et al. |
| 6,211,572 B1 | 4/2001 | Fjelstad et al. |
| 6,221,682 B1 | 4/2001 | Danziger et al. |

| | | | |
|---|---|---|---|
| 6,222,279 B1 | 4/2001 | Mis et al. |
| 6,238,951 B1 | 5/2001 | Caillat |
| 6,277,669 B1 | 8/2001 | Kung et al. |
| 6,320,262 B1 | 11/2001 | Murakami |
| 6,329,608 B1 | 12/2001 | Rinne et al. |
| 6,335,104 B1 | 1/2002 | Sambucetti et al. |
| 6,358,836 B1 | 3/2002 | Lu et al. |
| 6,376,354 B1 | 4/2002 | Yih |
| 6,378,691 B2 | 4/2002 | Phelps |
| 6,388,203 B1 | 5/2002 | Rinne et al. |
| 6,392,163 B1 | 5/2002 | Rinne et al. |
| 6,415,974 B2 | 7/2002 | Jao |
| 6,418,033 B1 | 7/2002 | Rinne |
| 6,419,974 B1 | 7/2002 | Silva et al. |
| 6,441,487 B2 | 8/2002 | Elenius et al. |
| 6,451,689 B1 * | 9/2002 | Kumamoto ................. 438/643 |
| 6,452,270 B1 | 9/2002 | Huang |
| 6,452,271 B2 | 9/2002 | Jiang et al. |
| 6,521,996 B1 | 2/2003 | Seshan |
| 6,605,525 B2 | 8/2003 | Lu et al. |
| 6,611,026 B2 | 8/2003 | Chang et al. |
| 6,620,722 B2 | 9/2003 | Kuo et al. |
| 6,622,907 B2 | 9/2003 | Fanti et al. |
| 6,642,550 B1 | 11/2003 | Whitworth et al. |
| 6,668,449 B2 | 12/2003 | Rumsey et al. |
| 6,670,098 B1 | 12/2003 | Kunita |
| 6,674,129 B1 | 1/2004 | Colclaser et al. |
| 6,734,532 B2 | 5/2004 | Koduri et al. |
| 6,762,122 B2 | 7/2004 | Mis et al. |
| 6,818,544 B2 | 11/2004 | Eichelberger et al. |
| 6,835,643 B2 | 12/2004 | Akram |
| 6,836,018 B2 | 12/2004 | Kim et al. |
| 6,853,076 B2 | 2/2005 | Datta et al. |
| 6,897,568 B2 | 5/2005 | Haimerl et al. |
| 6,917,119 B2 | 7/2005 | Lee et al. |
| 6,972,495 B2 | 12/2005 | Fjelstad |
| 6,982,494 B2 | 1/2006 | Anzai |
| 7,273,812 B2 * | 9/2007 | Kim et al. ................... 438/670 |
| 2001/0042918 A1 | 11/2001 | Yanagida |
| 2002/0000665 A1 | 1/2002 | Barr et al. |
| 2002/0079576 A1 | 6/2002 | Seshan |
| 2002/0086520 A1 | 7/2002 | Chiang |
| 2002/0093082 A1 | 7/2002 | Miyamoto et al. |
| 2002/0093098 A1 | 7/2002 | Barr et al. |
| 2003/0060040 A1 | 3/2003 | Lee et al. |
| 2003/0107137 A1 | 6/2003 | Stierman et al. |
| 2004/0262758 A1 | 12/2004 | Hashimoto |

FOREIGN PATENT DOCUMENTS

| | | |
|---|---|---|
| DE | 42 05 029 C | 2/1993 |
| DE | 43 23 799 A1 | 1/1994 |
| DE | 197 41 436 | 12/1998 |
| EP | 0 603 296 | 6/1994 |
| EP | 0 609 062 A1 | 8/1994 |
| EP | 0 736 972 A1 | 10/1996 |
| EP | 0 782 191 | 2/1997 |
| EP | 1146552 | 10/2001 |
| FR | 2 406 893 | 10/1978 |
| FR | 2 688 628 | 9/1993 |
| FR | 2 705 832 | 12/1994 |
| GB | 1288564 | 9/1972 |
| GB | 2062 963 | 5/1981 |
| GB | 2 194 387 | 3/1988 |
| JP | 54-128669 | 10/1979 |
| JP | 55-111127 | 8/1980 |
| JP | 57-73952 | 5/1982 |
| JP | 57-197838 | 12/1982 |
| JP | 59-154011 | 9/1984 |
| JP | 6-116552 | 1/1986 |
| JP | 63099558 | 4/1988 |
| JP | 63-222445 | 9/1988 |
| JP | 63285955 | 11/1988 |
| JP | 04116955 | 4/1992 |
| JP | 4-150033 | 5/1992 |
| JP | 07066207 | 1/1994 |
| JP | 06184824 | 7/1994 |
| WO | WO93/02831 | 2/1993 |
| WO | WO93/22475 | 11/1993 |
| WO | WO 96/30933 | 10/1996 |
| WO | WO96/31905 | 10/1996 |
| WO | WO98/06118 | 2/1998 |
| WO | WO 02/03461 | 1/2002 |

OTHER PUBLICATIONS

Lineback, "3D IC Packaging Moves Closer to Commercial Use", Electronic World News, May 21, 1990, p. 15.

Multimedia Card Association, www.mmca.org.

SanDisk Corporation, SanDisk Flash Data Storage, San Disk Compact Flash™ and MultiMedia Card: Small Form Factor Solutions, 1999.

Guckel et al., *Electromagnetic Linear Actuators with Inductive Position Sensing for Micro Relay, Micro Value and Precision Positioning Applications*, Transducers '95, Eurosensors IX, The 8$^{th}$ International Conference on Solid-State Sensors and Actuators, and Eurosensors IX, pp. 324-327.

Hashimoto et al. *Thermally Controlled Magnetization Microrelay*, Transducers '95, Eurosensors IX, The 8$^{th}$ International Conference on Solid-State Sensors and Actuators, and Eurosensors IX, pp. 361-364.

Drake et al. *An Electrostatically Actuated Micro-Relay*, Transducers '95, Eurosensors IX, The 8$^{th}$ International Conference on Solid-State Sensors and Actuators, and Eurosensors IX, pp. 380-383.

Knüppel, *Rugged Design for Reliable Switching: Micro a Relay Sets New Automotive Standards*, Components XXIX (1994), No. 4, pp. 30-32.

Hosaka et al. Electromagnetic Microrelays: Concepts and Fundamental Characteristics, Sensors and Actuators A, 40 (1994), pp. 41-47.

Specification Sheet, *NaiS, Ultra Low Profile 2 Amp-Polarized Relay*, TK-Relays.

PCB Assembly, *Electronic Packaging & Production*, vol. 35, No. 1, p. 40 (Jan. 1995).

Adema et al., *Flip Chip Technology: A Method for Providing Known Good Die with High Density Interconnections*, MCM '94 Proceedings, pp. 41-49.

Datta et al., *Electrochemical Fabrication of Mechanically Robust PbSn C4 Interconnections*, J. Electrochem. Soc., vol. 142, No. 11, The Electrochemical Society, Inc., Nov. 1995, pp. 3779-3785.

Hirsch, *Tin-Lead, Lead and Tin Plating*, Metal Finishing, Guidebook Directory 1987, 55$^{th}$ Guidebood-Directory Issue 1987, Mid Jan. 1987, vol. 85, No. 1A, ISSN 0026-0576, pp. 280-284.

Inaba et al. *Solder Bump Formation Using Electroless Plating and Ultrasonic Soldering*, IEEE Transactions on Components, Hybrids, and Manufacturing Technology, vol. 13, No. 1, Mar. 1990, pp. 119-123.

K. Yung et al. *Electroplated Solder Joints for Flip-Chip Applications*, Transactions on Components, Hybrids, and Manufacturing Technology, vol. 14 No. 3, Sep. 1991, pp. 549-559.

E. K. Yung et al. *Flip-Chip Process Utilizing Electroplated Solder Joints*, Proceedings of the Technical Conference, 1990 International Electronics Packaging Conference, Sep. 10-12, 1990, pp. 1065-1079.

T.G. Tessier et al. *Process Considerations in Fabricating Thin Film Multi-chip Modules*, Proceedings of the Technical Conference 1989 International Electronics Packaging Conference, 1989.

PCT International Search Report dated Dec. 9, 1992 of International Appln. No. PCT/US 92/07722 filed Sep. 11, 1992.

Edelstein, D.C., et al. Derwent Publications Ltd. London, GB: AN 2002-308284 XP-002243726.

International Search Report for PCT/US 02/30697.

Jean Audel, et al. *Low Cost Bumping Process for Flip Chip*, Proc. 1995 International Flip Chip, BGA, and Ado Pkg. Symposium ITAP 95, '95 Flip Chip, BGA, TAB & AP Symposium, pp. 16-21 (1995).

J.D. Mis, et al. *Flip Chip Production Experience: Some Design, Process, Reliability, and Cost Considerations*, ISHM '96 Proceedings, Proc. 1996 International Symposium on Microelectronics SPIE vol. 2920, pp. 291-295 (1996).

S.K. Kang, et al. *Interfacial Reactions During Soldering With Lead-Tin Eutectic and Lead (Pb)-Free, Tin-Rich Solders, Journal of Electronic Materials*, vol. 25, No. 7, pp. 1113-1120 (1996).

Eric Jung, et al., *The Influence of NiSn Intermetallics on the Performance of Flip Chip Contacts Using a Low Cost Electroless Nickel Bumping Approach*, IEPS Proceedings of the Technical Conference, 1996 Electronics Packaging Conference, Austin, Texas, pp. 14-25 (Sep. 29-Oct. 1, 1996).

International Search Report for PCT/US 03/20790.

W.J. Choi et al. *Electromigration of Flip Chip Solder Bump on Cu/Ni(V) Al Thin Film Under Bump Metallization*; 2002 Electronic Components and Technology Conference; pp. 1201-1205.

K. Zeng et al. *Six cases of reliability study of Pb-free solder joints in electronic packaging technology*, Reports: A Review Journal; Materials Science and Engineering R 38 (2002) pp. 55-105.

Electrolytic Capacitors http://www.ami.ac.uk/courses/topics/0136_ec/.

Panasonic "Outline of specialty polymer aluminum electrolytic capacitor products" *Technical Guide of Speciality Polymer Aluminum Electrolytic Capacitors*. Apr. 2001.

"Experimental Product RP-695-2" Non-Conductive WBL Film for Die Encapsulation, Ablestik Jun. 2001.

T.L. Hoopman et al. "New Film Type Die Attach, Adhesives" 3M; IEEE pp. 473-479.

\* cited by examiner

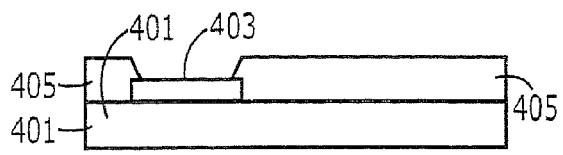
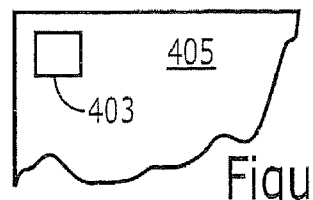
Figure 4a  Figure 5a
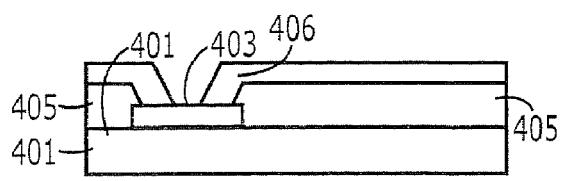
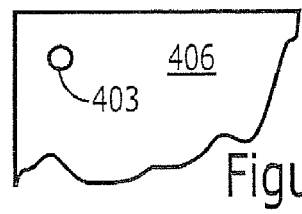
Figure 4b  Figure 5b
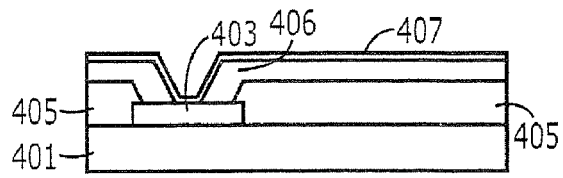
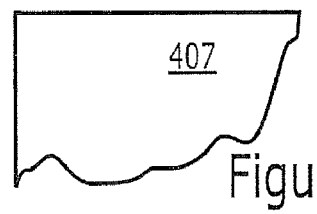
Figure 4c  Figure 5c
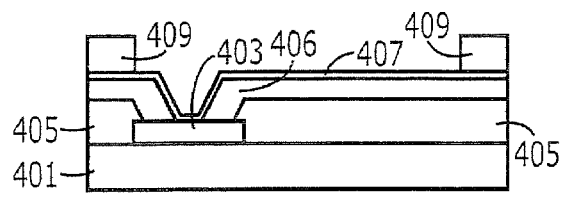
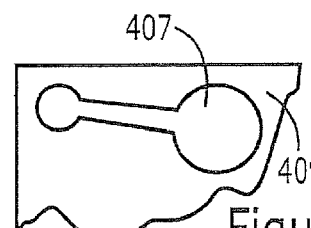
Figure 4d  Figure 5d
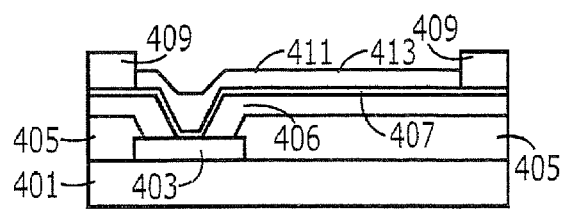
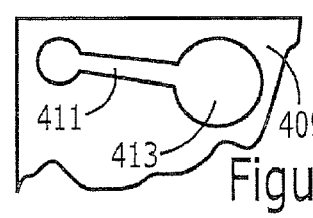
Figure 4e  Figure 5e
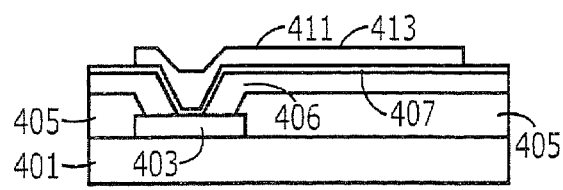
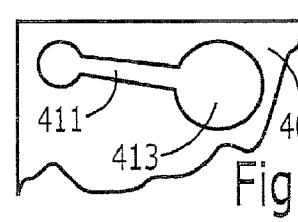
Figure 4f  Figure 5f

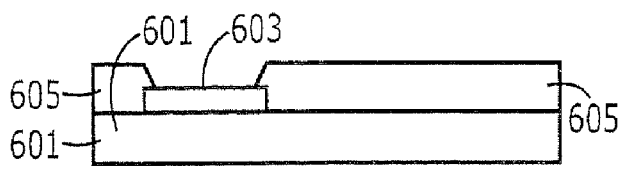
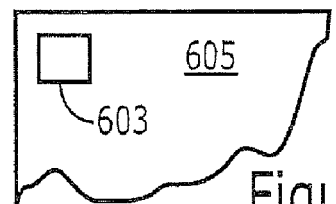
Figure 6a / Figure 7a
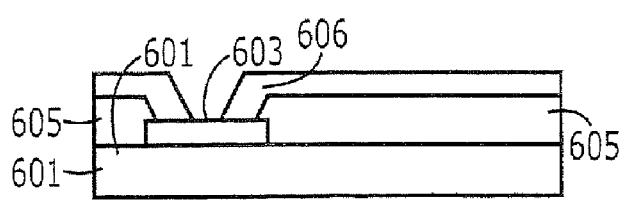
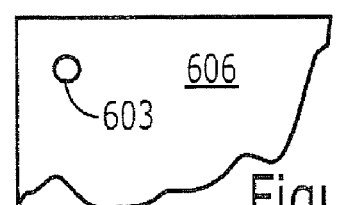
Figure 6b / Figure 7b
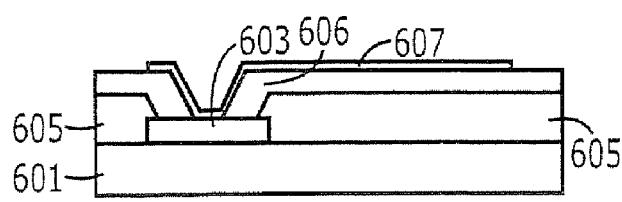
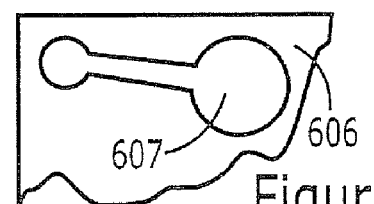
Figure 6c / Figure 7c
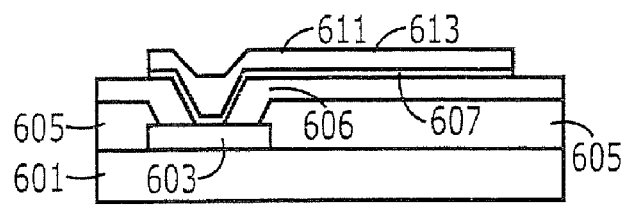
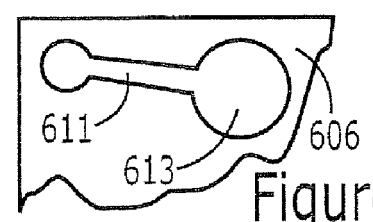
Figure 6d / Figure 7d
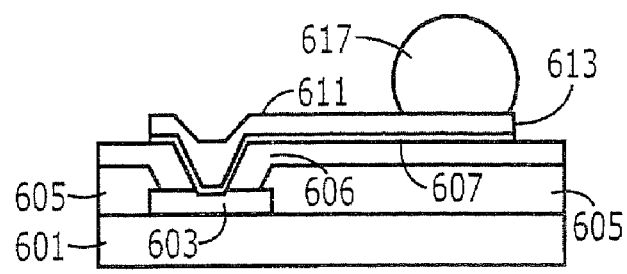
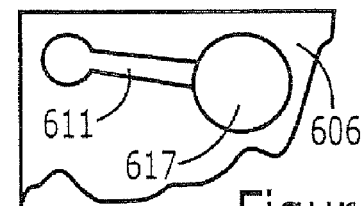
Figure 6e / Figure 7e

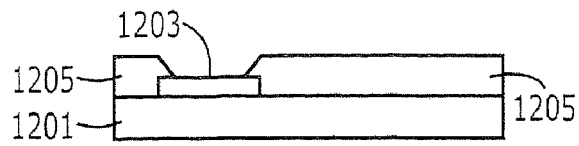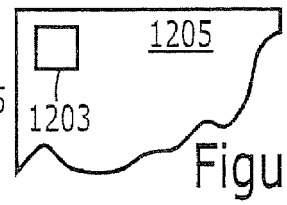
Figure 12a  Figure 13a
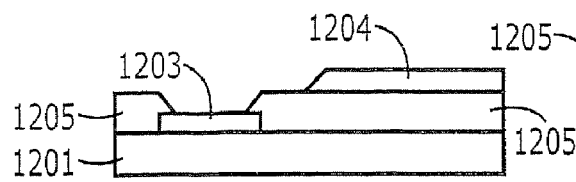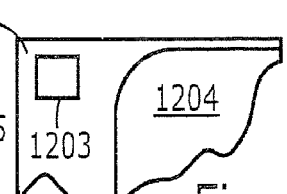
Figure 12b  Figure 13b
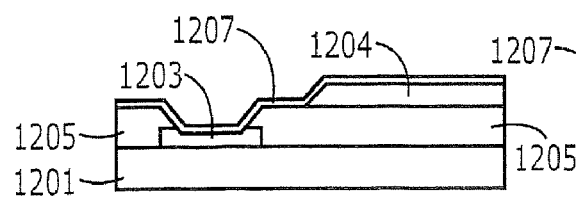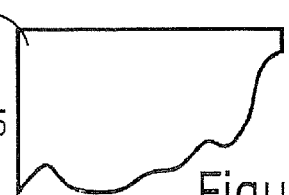
Figure 12c  Figure 13c
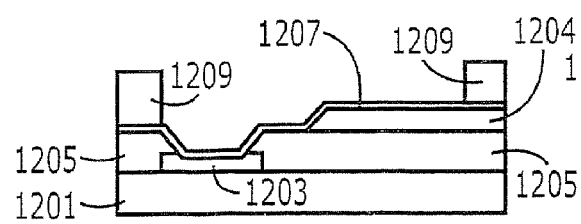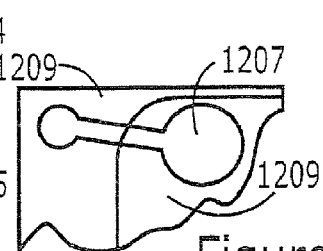
Figure 12d  Figure 13d
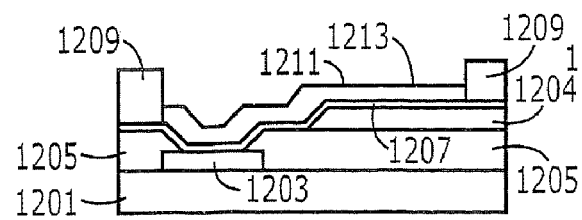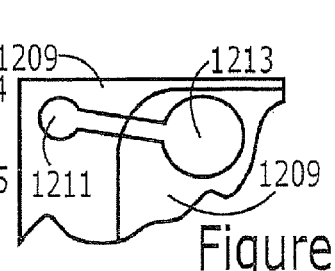
Figure 12e  Figure 13e

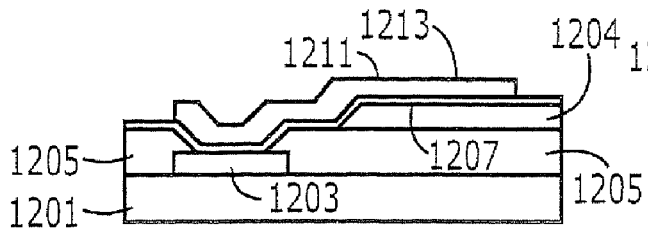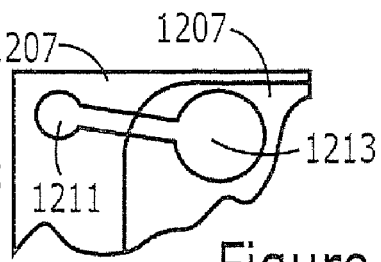
Figure 12f        Figure 13f
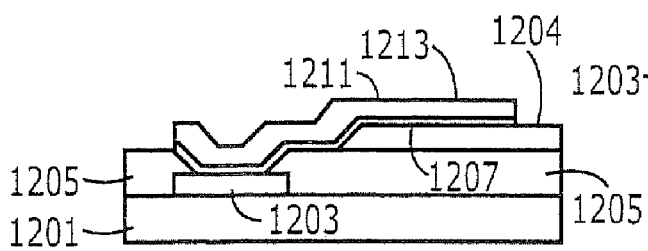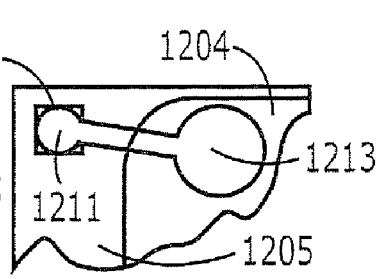
Figure 12g        Figure 13g
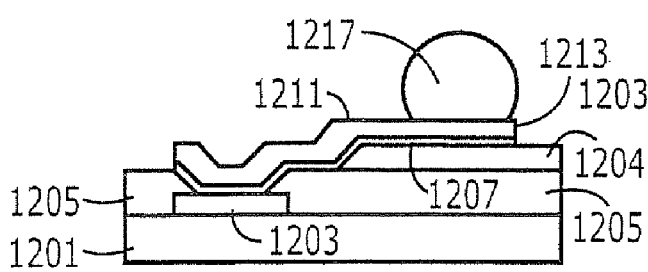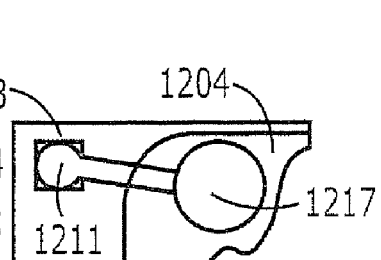
Figure 12h        Figure 13h

METHODS OF FORMING METAL LAYERS USING MULTI-LAYER LIFT-OFF PATTERNS

RELATED APPLICATION

The present application claims the benefit of priority from U.S. Provisional Application No. 60/771,420 filed Feb. 8, 2006, the disclosure of which is hereby incorporated herein in its entirety by reference. The present application is also related to U.S. application Ser. No. 11/671,026, filed concurrently herewith and entitled "Methods Of Forming Electronic Interconnections Including Compliant Dielectric Layers And Related Devices," the disclosure of which is hereby incorporated herein in its entirety by reference.

FIELD OF THE INVENTION

The present invention relates to the field of electronics, and more particularly, to methods of providing electrical/mechanical interconnection between electronic substrates and related structures.

BACKGROUND

U.S. Pat. No. 6,211,572 to Fjelstad et al entitled "Semiconductor Chip Package With Fan-In Leads" discusses a compliant semiconductor chip package with fan-in leads. The package contains a multiplicity of bond ribbons connected between the contacts of a semiconductor chip and corresponding terminals on a top surface of a compliant layer. The compliant layer provides stress/strain relief to the bond ribbons encountered during handling or affixing the assembly to an external substrate. The chip package also contains a dielectric layer adjacent to at least one end of the bond ribbons. The dielectric layer relieves mechanical stresses/strains associated with the thermal mismatch of assembly and substrate materials during thermal cycling. The assembly can be manufactured without the need for any bond wiring tools since the bond ribbons are patterned and formed during a standard photolithographic stage within the manufacturing process. The manufacturing process is also amenable to simultaneous assembly of a multiplicity of undiced chips on a wafer or simultaneous assembly of diced chips in a processing boat. The disclosure of U.S. Pat. No. 6,211,572 is incorporated herein in its entirety by reference.

Wafer level packaging is also discussed in the reference by Gonzales et al. entitled "An Analysis Of The Reliability Of A Wafer Level Package (WLP) Using A Silicone Under The Bump (SUB) Configuration" (IEEE, 2003 Electronic Components And Technology Conference, pages 857-863). As discussed in the Gonzales et al. reference, wafer level chip scale package (WL-CSP) reliability can be improved using a Silicone Under the Bump structure. The silicone bump absorbs the thermal deformation mismatch between the silicon wafer level package (WLP) and the FR4 printed circuit board.

SUMMARY

According to some embodiments of the present invention, methods of forming interconnections for an electronic device including a substrate may be provided. More particularly, first and second patterned layers may be formed on the substrate wherein an opening in the first and second patterned layers exposes portions of the substrate, wherein the first and second patterned layers have different compositions, and wherein the first patterned layer is between the second patterned layer and the substrate. A metal layer may be formed on the second patterned layer and on portions of the substrate exposed through the opening in the first and second patterned layers. The second patterned layer and portions of the metal layer thereon may be removed while maintaining portions of the metal layer on the portions of the substrate exposed through the opening. After removing the second mask layer, solder may be provided on the metal layer.

Providing the solder on the metal layer may include providing a preformed solder mass on the metal layer while maintaining the first patterned layer after removing the second patterned layer, and bonding the solder mass to the metal layer. After removing the second patterned layer and before providing the solder, a second metal layer may be selectively formed on the first metal layer so that the second metal layer is between the solder and the first metal layer. Moreover, selectively forming the second metal layer may include plating the second metal layer, and/or forming the first metal layer may include sputtering the first metal layer.

Providing solder on the metal layer may include providing solder on the metal layer while maintaining the first patterned layer, and/or the first patterned layer may include a photo-imageable epoxy. Moreover, forming the first and second patterned layers may include providing the first and second mask layers as a pre-laminated dry film, and then applying the pre-laminated dry film to the substrate.

Forming the first and second patterned layers may include forming first and second photo-sensitive layers on the substrate, selectively exposing the first and second photo-sensitive layers to radiation using a photo-mask, and developing the first and second photo-sensitive layers. Moreover, forming the first and second photo-sensitive layers may include coating the first and second photo-sensitive layers using different solvents for the first and second photo-sensitive layers. For example, one of the first and second photo-sensitive layers may be coated using an organic solvent and the other of the first and second photo-sensitive layers may be coated using an inorganic solvent, and/or one of the first and second photo-sensitive layers may be coated using an aqueous solvent and the other of the first and second mask layers is coated using an non-aqueous solvent.

According to other embodiments of the present invention, additional methods of forming interconnections for an electronic device including a substrate may be provided. More particularly, first and second patterned layers may be formed on the substrate wherein an opening in the first and second patterned layers exposes portions of the substrate, wherein the first and second patterned layers have different compositions, and wherein the first patterned layer is between the second patterned layer and the substrate. A first metal layer may be formed on the second patterned layer and on portions of the substrate exposed through the opening in the first and second patterned layers. The second patterned layer and portions of the first metal layer thereon may be removed while maintaining the first patterned layer and portions of the first metal layer on the portions of the substrate exposed through the opening. After removing the second mask layer, a second metal layer may be selectively formed on the first metal layer.

Selectively forming the second metal layer may include selectively forming the second metal layer while maintaining the first patterned layer, and/or the first patterned layer may include a photo-imageable epoxy. After selectively forming the second metal layer, solder may be provided on the second metal layer. Providing solder may include providing a preformed solder mass on the second metal layer while maintaining the first patterned layer, and bonding the solder mass to the second metal layer. Selectively forming the second metal layer may include plating the second metal layer, and/or forming the first metal layer may include sputtering the first metal layer.

Forming the first and second patterned layers may include forming first and second photo-sensitive layers on the substrate, selectively exposing the first and second photo-sensitive layers to radiation using a photo-mask, and developing the first and second photo-sensitive layers. Forming the first and second photo-sensitive layers may include coating the first and second photo-sensitive layers using different solvents for the first and second photo-sensitive layers. For example, one of the first and second photo-sensitive layers may be coated using an organic solvent and the other of the first and second photo-sensitive layers may be coated using an inorganic solvent, and/or one of the first and second photo-sensitive layers may be coated using an aqueous solvent and the other of the first and second mask layers may be coated using an non-aqueous solvent. According to other embodiments of the present invention, forming the first and second patterned layers may include providing the first and second patterned layers as a pre-laminated dry film, and then applying the pre-laminated dry film to the substrate.

BRIEF DESCRIPTION OF THE DRAWINGS

FIGS. 4a-h and 5a-h are cross sectional and corresponding plan views illustrating operations of forming solder structures according to some other embodiments of the present invention.

FIGS. 6a-e and 7a-e are cross sectional and corresponding plan views illustrating operations of forming solder structures according to still other embodiments of the present invention.

FIGS. 12a-h and 13a-h are cross sectional and corresponding plan views illustrating operations of forming solder structures according to still more embodiments of the present invention.

DETAILED DESCRIPTION

Figure 1A:
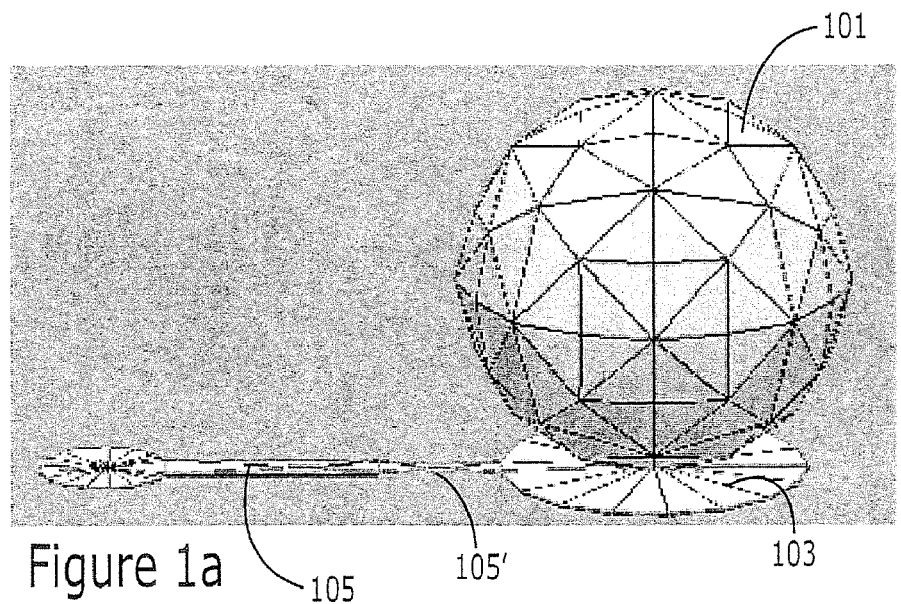
FIGS. 1a-c illustrate simulations of solder reflow according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Furthermore, relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to embodiments of the present invention, a Wafer Level Chip Scale Package (WLCSP) may include a Redistribution Line (RDL) formed of Under Bump Metallurgy (UBM) that is not covered by dielectric so there is no solder dam. During reflow after solder ball/mass placement on a bump pad, solder flow down the RDL may be reduced and/or prevented due to surface tension and the narrow line width of the RDL near the bump pad which may cause a pressure differential in the liquid solder between the pad and the RDL, and/or due to a contact angle between the solder and the RDL metal being greater on the line than the bump pad as a result of the presence of oxides on the metal surface of the RDL. The oxides on the bump pad may be chemically reduced by pattern-printed flux selectively printed on the bump pad, leaving oxide on the RDL line to reduce and/or prevent wetting of the solder down the RDL line. Bump height uniformity may be maintained by adjusting the bump pad diameter to account for a volume of solder that may flow down the line. By selectively printing flux on the bump pad before solder ball/mass placement, a patterning step used to form a solder dam and/or other material on the RDL line while exposing the bump pad can be eliminated. Accordingly, a number of photolithographic masking, developing, and/or etching operations can be reduced.

Redistribution wiring to a solder bump pad has been addressed according to a variety of methods. A propensity of solder to wet down a redistribution line (RDL) may result in loss of solder in the bump and possible collapse of the bump. For example, a glass 'solder dam' may be patterned across the RDL line to prevent and/or reduce a flow of solder from the bump pad down the RDL line. Use of a solder dam may control collapse of the bump (also referred to as the chip connection). This process may be referred to as a Controlled-Collapse Chip Connection or C4 process.

Two variations of the solder dam are discussed as follows. According to a first variation, a polymeric 'solder mask' defines a wettable area of a bump pad and restricts flow of solder down the RDL line (i.e., the bump pad is formed before forming the solder mask and then a wettable area of the bump pad is exposed by patterning the solder mask). According to a second variation, the RDL line is buried under a polymeric dielectric layer and only the wettable bump pad is formed at the top surface of the polymeric dielectric layer (i.e., the wettable bump pad is formed after forming the polymeric dielectric layer). In either case, photolithographic masking, developing, and/or etching steps may be needed to pattern the polymeric dielectric layer.

Redistribution lines are also discussed in U.S. Pat. No. 6,392,163, U.S. Pat. No. 6,388,203, U.S. Pat. No. 5,892,179, U.S. Pat. No. 6,389,691, and U.S. Pat. No. 6,329,608. The disclosures of each of these patents are hereby incorporated herein in their entirety by reference.

Processes according to embodiments of the present invention may control a flow of solder (after solder ball/mass placement) using an internal pressure in the liquid solder that is caused by surface tension. By the Laplace-Young relationship, the internal pressure (P), is related to the surface tension ($\gamma$), by the inverse of the curvature of the surface:

$$P = \gamma \left( \frac{1}{R_1} \cdot \frac{1}{R_2} \right)$$

where $R_1$ and $R_2$ are the two principal lines of curvature at a point.

Solving this expression using a finite element simulator known as Surface Evolver, it can be shown that solder can be confined to a bump pad without any material coatings on the bump pad. By creating a narrow region of the RDL line adjacent the bump pad, solder flow along the relatively narrow region of the RDL line can be reduced and/or prevented by the decrease in the radius of curvature of the liquid solder. The resulting increase in pressure may cause liquid solder on the narrow region of the RDL line to be drawn back into the solder bump on the bump pad (because the bump pad has a width greater than a width of the relatively narrow region of the bump pad).

Simulation results are discussed below with respect to FIGS. 1a-c. In the first perspective view of FIG. 1a, a preformed solder ball 101 is placed on the solder bump pad 103 of a UBM (under bump metallurgy) coated RDL line 105 on the surface of an integrated circuit chip or other substrate. While preformed solder balls are discussed herein by way of example, any preformed solder mass may be used.

Figure 1B:
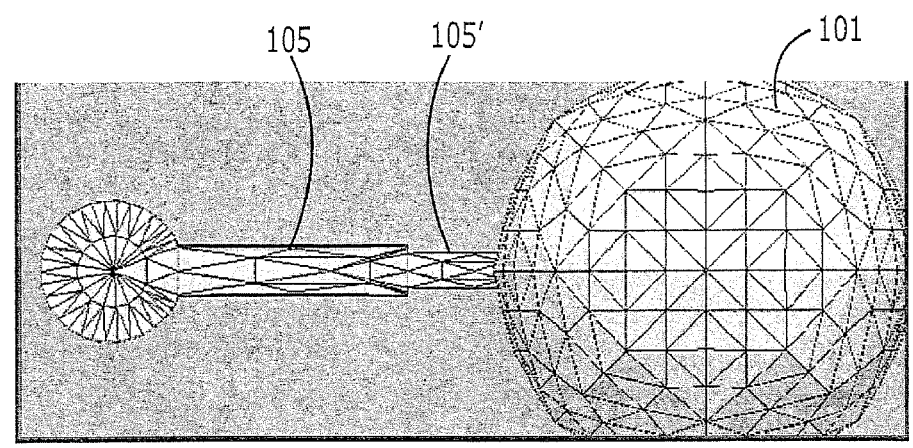
Figure 1C:
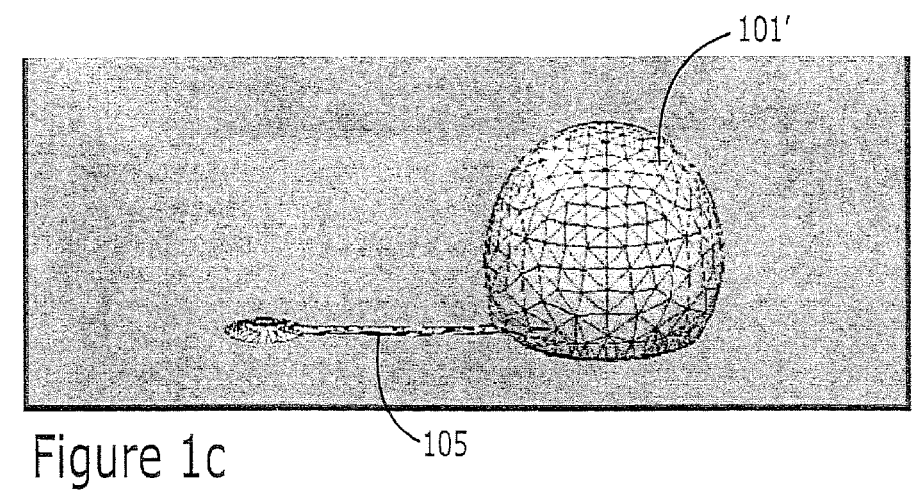

In the magnified plan view of FIG. 1b, the narrowed region 105' of the RDL line 105 adjacent the solder bump pad is shown more clearly. In this simulation, the UBM on the RDL line 105 and on the solder bump pad 103 has been coated with a 1 micron film of solder to ensure that wettability is complete and not limited by the energy of the wetting front (wetting angle). In the second perspective view of FIG. 1c, the simulation has run to equilibrium and solder from the solder ball 101 has not significantly flowed down the RDL line 105.

Figure 19:
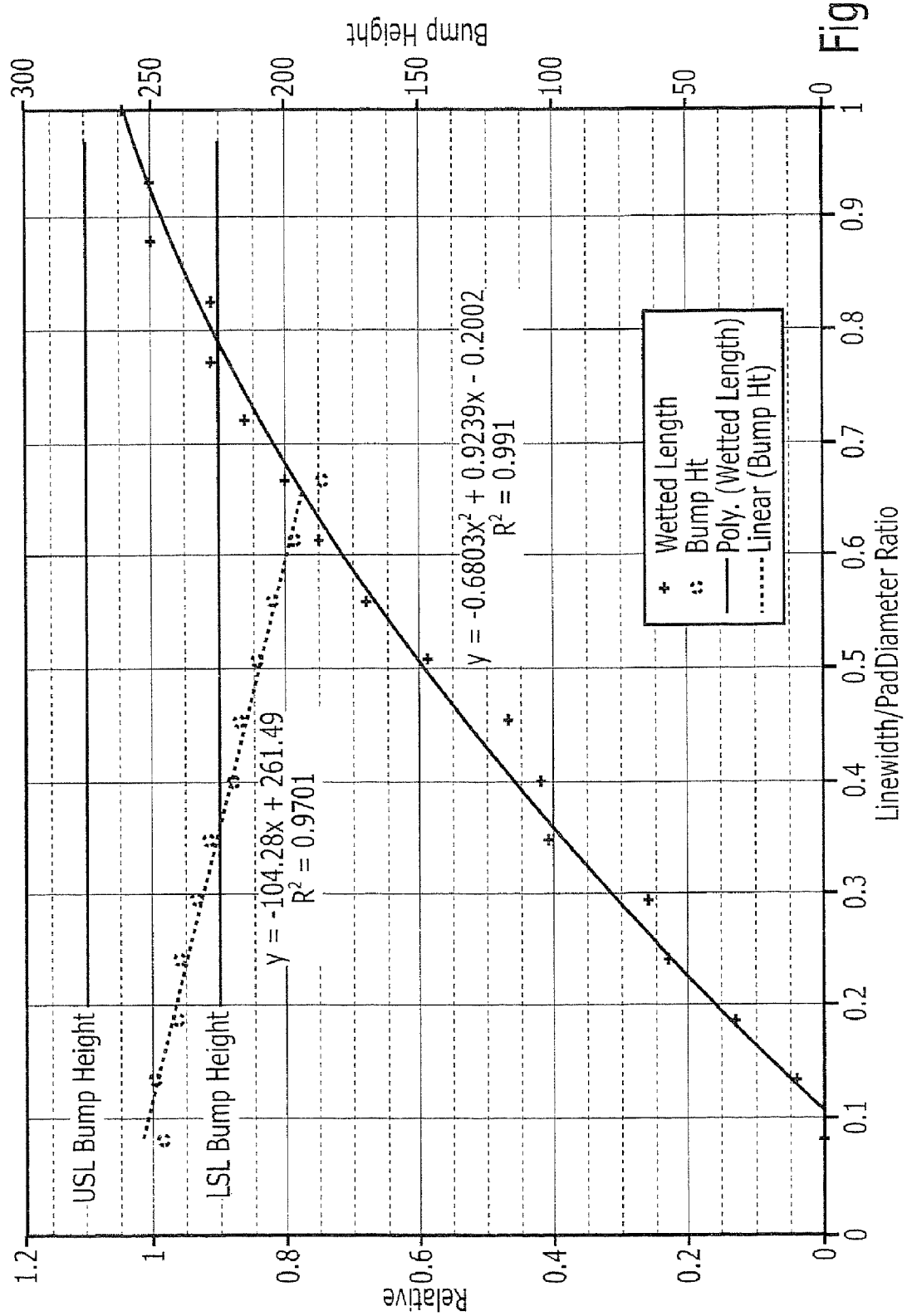
FIG. 19 is a graph illustrating relationships between solder wetting down redistribution lines (RDLs) and resulting bump heights as functions of RDL line width with fixed bump pad diameters.

FIG. 19 is a graph illustrating relationships between solder wetting down redistribution lines (RDLs) and resulting bump heights as functions of RDL line width with fixed bump pad diameters and with fixed solder ball diameters before reflow. In particular, the data of FIG. 19 is provided for bump pads having a 245 μm (micrometer) diameter with RDL linewidths ranging from 20 μm (micrometer) to 24 μm (micrometer) in 13 μm (micrometer) increments. As shown by the data points designated with crosses ("+") with respect to the left side vertical axis, the wetted length of the RDL increases with increasing linewidth (shown on the horizontal axis as a ratio of linewidth to bump pad diameter) for a fixed bump pad diameter when a solder ball (of fixed diameter) on the bump pad is subjected to reflow. As shown by the data points designated with circles ("∘") with respect to the right side vertical axis (measured in micrometers), the bump height decreases with increasing linewidth for a fixed bump pad diameter when a solder ball (of fixed diameter) on the bump pad is subjected to reflow due to increasing solder flow down the RDL. In FIG. 19, data for wetted line lengths is provided for 18 different linewidths (i.e., from 20 micrometers to 241 micrometers in 13 micrometer increments), while data for bump height is provided for only the first 12 linewidths (i.e., from 20 micrometers to 163 micrometers in 13 micrometer increments).

Figure 2A:
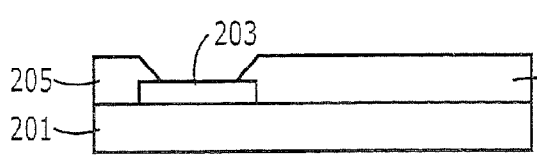
FIGS. 2a-g and 3a-g are cross sectional and corresponding plan views illustrating operations of forming solder structures according to some embodiments of the present invention.
Figure 2B:
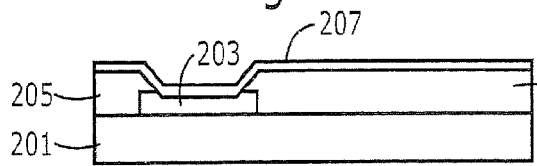

A process flow according to some embodiments of the present invention is discussed below with respect to the cross sectional views of FIGS. 2a-g and the corresponding plan views of FIGS. 3a-g. As shown in FIGS. 2a and 3a, an electronic device (such as an integrated circuit semiconductor device) may include a substrate 201 (such as a semiconductor substrate), a wirebond pad 203 (also referred to as an input/output pad), and an insulating passivation layer 205. As shown in FIGS. 2b and 3b, a seed layer 207 may be formed (for example, using sputtering) on the passivation layer 205 and on exposed portions of the wirebond pad 203. The seed layer 207 may include an adhesion layer (such as a layer of titanium-tungsten TiW) on the passivation layer 205 and a conduction layer (such as a layer of copper Cu) on the adhesion layer. In an alternative, the seed layer 207 may include a layer of aluminum on the passivation layer 205, and layer of nickel vanadium (Ni:V) on the aluminum layer, and a layer of copper on the nickel vanadium layer.

Figure 2C:
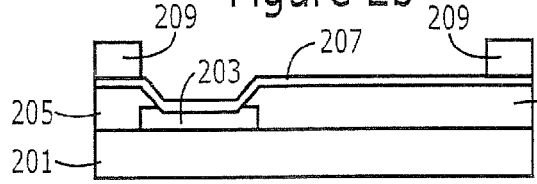
Figure 3A:
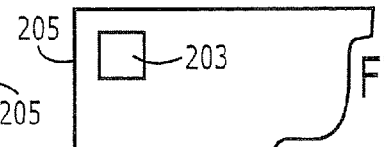
Figure 3B:
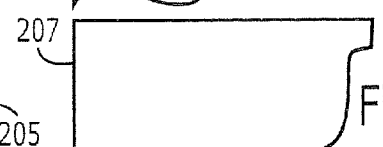
Figure 3C:
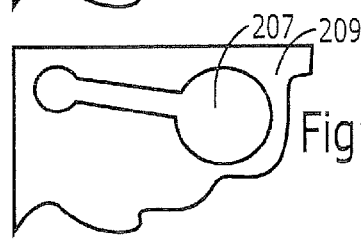

As shown in FIGS. 2c and 3c, a patterned photoresist layer 209 (or other masking material) may be formed on the seed layer 207, and the patterned photoresist layer 209 may expose portions seed layer 207 on which an RDL line and bump pad will be plated. Stated in other words, the patterned photoresist layer 209 may provide a plating template to plate an RDL line and bump pad. Moreover, the patterned photoresist layer 209 may be formed using photolithographic coat, expose, and develop operations.

Figure 2D:
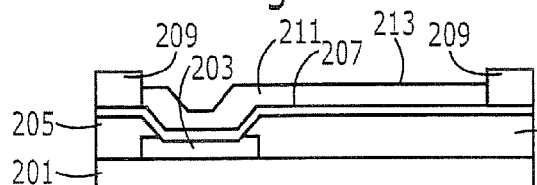
Figure 2E:
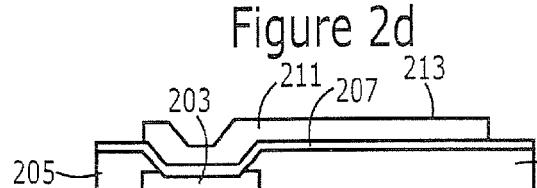
Figure 3D:
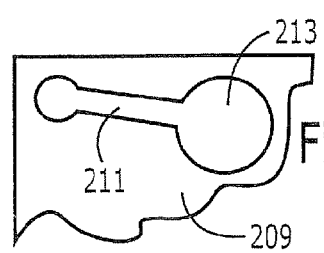
Figure 3E:
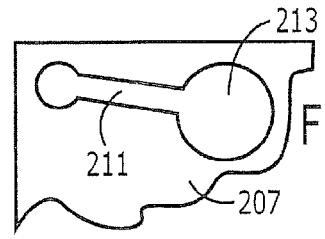

As shown in FIGS. 2d and 3d, the RDL 211 and bump pad 213 may be plated on portions of the seed layer 207 exposed through the photoresist layer 209, and the photoresist layer 209 may be removed as shown in FIGS. 2e and 3e. More particularly, the RDL 211 and bump pad 213 may include a conduction layer (such as a layer of copper) on the seed layer 207, a barrier layer (such as a layer nickel) on the conduction layer, and a conductive passivation layer (such as a layer of gold) on the barrier layer. In an alternative, an organic solderability preservative may be provided as a passivation layer (instead of gold). The RDL passivation layer may be provided to protect against oxidation of the RDL 211 and bump pad 213. As used herein, the term RDL may be defined to include both the relatively narrow RDL 211 and the relatively wide bump pad 213. Moreover, compositions of the RDL 211 and bump pad 213 other than those discussed above may be used. For example, a conductive passivation layer may be omitted or a material other than gold may be provided as a conductive passivation layer.

Figure 2F:
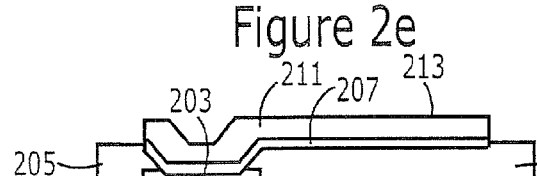
Figure 2G:
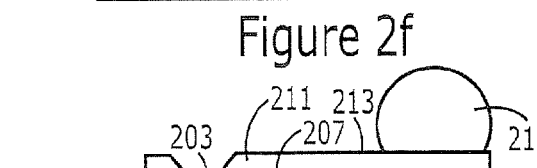
Figure 3F:
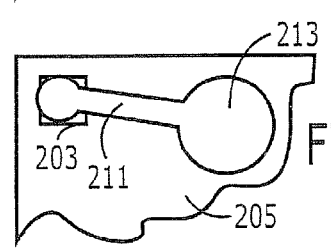
Figure 3G:
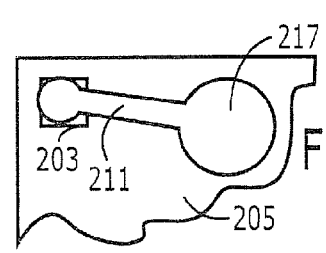

Portions of the seed layer 207 not covered by the RDL 211 and/or the bump pad 213 may be removed, for example, using a chemical etch, as shown in FIGS. 2f and 3f. A preformed solder ball may then be placed on the bump pad 213 and subjected to a reflow operation to provide a solder bump 217 as shown in FIGS. 2g and 3g. By providing that a width of the RDL 211 is sufficiently less than a width of the bump pad 213, flow of solder down the RDL 211 during the reflow operation may be reduced and/or prevented. While preformed solder balls are discussed by way of example, any preformed solder mass may be used.

In addition or in an alternative, flux can be selectively applied to the bump pad 213 (without applying flux to the RDL 211 or portions thereof) before placing the preformed solder ball to reduce and/or prevent flow of solder down the RDL 211 during the reflow operation. By not providing flux on the RDL 211, a native oxide on the RDL 211 may be maintained on the RDL 211 during the reflow operation, and a non-wetting characteristic of the native oxide may reduce and/or prevent flow of solder thereon. Flux may be selectively applied to the bump pad 213, for example, using a flux stamp, printing, etc. In another alternative, solder may be plated on the RDL 211 and the bump pad 213 before removing the patterned photoresist layer 209, and the reflow operation may cause solder to flow from the RDL 211 to the bump pad 213. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from the RDL 211 to the bump pad 213.

Figure 4G:
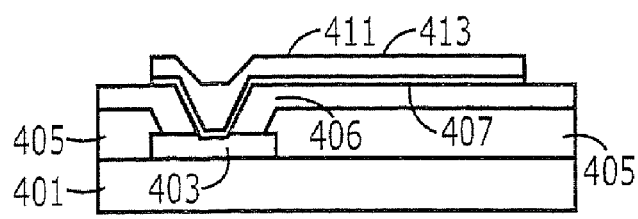
Figure 5G:
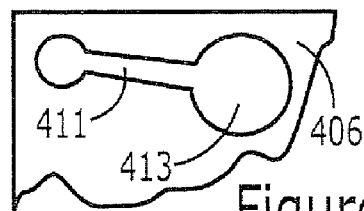

A process flow according to some other embodiments of the present invention is discussed below with respect to the cross sectional views of FIGS. 4a-h and the corresponding plan views of FIGS. 5a-h. As shown in FIGS. 4a and 5a, an electronic device (such as an integrated circuit semiconductor device) may include a substrate 401 (such as a semiconductor substrate), a wirebond pad 403 (also referred to as an input/output pad), and an insulating passivation layer 405. As shown in FIGS. 4b and 5b, a protective layer 406 (such as a blanket layer of polyimide) may be deposited on the wirebond pad 403 and the passivation layer 405, and the protective layer 406 may be patterned to expose portions of the wirebond pad 403. While not shown in FIGS. 4b and 5b, the protective layer 406 may also be patterned to expose portions of dicing streets between integrated circuit devices on a manufacturing wafer.

A seed layer 407 may be formed (for example, using sputtering) on the protective layer 406 and on exposed portions of the wirebond pad 403, as shown in FIGS. 4c and 5c. The seed layer 407 may include an adhesion layer (such as a layer of titanium-tungsten TiW) on the protective layer 406 and a conduction layer (such as a layer of copper Cu) on the adhesion layer. In an alternative, the seed layer 407 may include a layer of aluminum on the protective layer 406, and layer of nickel vanadium (Ni:V) on the aluminum layer, and a layer of copper on the nickel vanadium layer.

As shown in FIGS. 4d and 5d, a patterned photoresist layer 409 (or other masking layer) may be formed on the seed layer 407, and the patterned photoresist layer 409 may expose portions of seed layer 407 on which an RDL line and bump pad will be plated. Stated in other words, the patterned photoresist layer 409 may provide a plating template to plate an RDL line and bump pad. Moreover, the patterned photoresist layer 409 may be formed using photolithographic coat, expose, and develop operations.

As shown in FIGS. 4e and 5e, the RDL 411 and bump pad 413 may be plated on portions of the seed layer 407 exposed through the photoresist layer 409, and the photoresist layer 409 may be removed as shown in FIGS. 4f and 5f. More particularly, the RDL 411 and bump pad 413 may include a conduction layer (such as a layer of copper) on the seed layer 407, a barrier layer (such as a layer nickel) on the conduction layer, and a conductive passivation layer (such as a layer of gold) on the barrier layer. In an alternative, an organic solderability preservative may be provided as a passivation layer (instead of gold). The RDL passivation layer may be provided to protect against oxidation of the RDL 411 and bump pad 413. As used herein, the term RDL may be defined to include both the relatively narrow RDL 411 and the relatively wide bump pad 413. Moreover, compositions of the RDL 411 and bump pad 413 other than those discussed above may be used. For example, a conductive passivation layer may be omitted or a material other than gold may be provided as a conductive passivation layer.

Figure 4H:
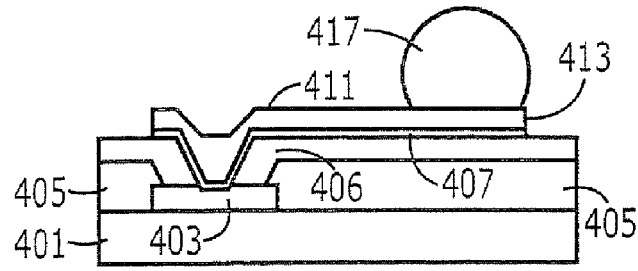
Figure 5H:
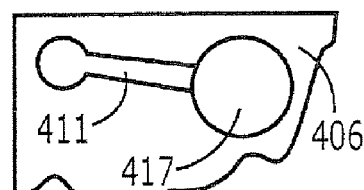

Portions of the seed layer 407 not covered by the RDL 411 and/or the bump pad 413 may be removed, for example, using a chemical etch, as shown in FIGS. 4g and 5g. A preformed solder ball may then be placed on the bump pad 413 and subjected to a reflow operation to provide a solder bump 417 as shown in FIGS. 4h and 5h. By providing that a width of the RDL 411 is sufficiently less than a width of the bump pad 413, flow of solder down the RDL 411 during the reflow operation may be reduced and/or prevented. While preformed solder balls are discussed by way of example, any preformed solder mass may be used.

In addition or in an alternative, flux can be selectively applied to the bump pad 413 (without applying flux to the RDL 411 or portions thereof) before placing the preformed solder ball to reduce and/or prevent flow of solder down the RDL 411 during the reflow operation. By not providing flux on the RDL 411, a native oxide on the RDL 411 may be maintained on the RDL 411 during the reflow operation, and a non-wetting characteristic of the native oxide may reduce and/or prevent flow of solder thereon. Flux may be selectively applied to the bump pad 413, for example, using a flux stamp, printing, etc. In another alternative, solder may be plated on the RDL 411 and the bump pad 413 before removing the patterned photoresist layer 409, and the reflow operation may cause solder to flow from the RDL 411 to the bump pad 413. According to other embodiments of the present invention, a solder mass may be provided, for example, using a screen printed solder paste, using a printed solder, using a jetted solder, using evaporated solder, a plated solder, etc. According to still other embodiments of the present invention, flux may be coated on an entire surface of the structure including the RDL 411, thus bump pad 413, and the protective layer 406 before providing the solder bump 417. A reflow operation may then be used provide a rounded solder bump and/or to flow solder from the RDL 411 to the bump pad 413.

The protective layer 406 of the process flow of FIGS. 4a-h and 5a-h may be provided to protect the passivation layer 405 and/or the wirebond pad 403 from chemicals used in subsequent processing steps. While polyimide is discussed above by way of example, other materials such as silicones, elastomers, flexibilized epoxies, thermosetting polymers, fluoropolymers, and/or thermoplastic polymers may be used for the protective layer 406. Other materials for protective layers are discussed, for example, in U.S. Pat. No. 6,211,572, the disclosure of which is hereby incorporated herein in its entirety by reference.

While not shown in the process flow of FIGS. 4a-h and 5a-h, the protective layer 406 may extend onto dicing streets between integrated circuit device die of a wafer (including a plurality of integrated circuit device die) to "seal" the passivation layer 405. More particularly, the passivation layer 405 may be removed from the dicing streets between the die so that the substrate 401 (or other material on the substrate) is exposed on the dicing streets between die before forming the protective layer 406.

According to some embodiments of the present invention, the protective layer 406 may extend onto portions of the dicing streets free of the passivation layer 405 surrounding each of the die without extending across the dicing streets. Central portions of the dicing streets through which the dicing saw will cut during subsequent dicing operations may be free of the protective layer 406 to reduce damage to the protective layer 406 when the wafer is diced to separate individual die. In other words, during a patterning step to expose portions of the wirebond pad 403 through the protective layer 406, portions of the protective layer 406 on central portions of the dicing streets may be removed while maintaining portions of the protective layer 406 on edge portions of the dicing streets that are free of the passivation layer 405. According to other embodiments of the present invention, the protective layer 406 may extend across the dicing streets between the die during dicing operations so that portions of the protective layer 406 in central portions of the dicing street are cut with the substrate 401.

A process flow according to some other embodiments of the present invention is discussed below with respect to the cross sectional views of FIGS. 6a-e and the corresponding plan views of FIGS. 7a-e. As shown in FIGS. 6a and 7a, an electronic device (such as an integrated circuit semiconductor device) may include a substrate 601 (such as a semiconductor substrate), a wirebond pad 603 (also referred to as an input/output pad), and an insulating passivation layer 605. As shown in FIGS. 6b and 7b, a protective layer 606 (such as a blanket layer of polyimide) may be deposited on the wirebond pad 603 and the passivation layer 605, and the protective layer 606 may be patterned to expose portions of the wirebond pad 603. While not shown in FIGS. 6b and 7b, the protective layer 606 may also be patterned to expose portions of dicing streets between integrated circuit devices on a manufacturing wafer.

A seed layer 607 may be selectively formed and/or patterned on the protective layer 606 and on exposed portions of the wirebond pad 603, as shown in FIGS. 6c and 7c. The seed layer 607 may include an adhesion layer (such as a layer of titanium-tungsten TiW) on the protective layer 606 and a conduction layer (such as a layer of copper Cu) on the adhesion layer. In an alternative, the seed layer 607 may include a layer of aluminum on the protective layer 606, and layer of nickel vanadium (Ni:V) on the aluminum layer, and a layer of copper on the nickel vanadium layer. In still another alternative, the seed layer 607 may include a titanium tungsten (TiW) layer on the protective layer 606 and a nickel layer (Ni) on the titanium tungsten layer.

The seed layer 607 may be formed by forming a continuous seed layer (for example, using sputtering) on the protective layer 606, forming a photoresist mask on portions of the continuous seed layer corresponding to the RDL and bump pad, and removing portions of the seed layer exposed by the photoresist mask. The photoresist mask may then be stripped to provide the structure of FIGS. 6c and 7c.

In an alternative, the seed layer 607 may be formed by aligning a shadow mask over the protective layer 606 so that the shadow mask exposes portions of the protective layer 606 corresponding to the RDL and bump pad. The seed layer may then be deposited on the exposed portions of the protective layer 606 and on the shadow mask, for example, using evaporation, sputtering, and/or chemical vapor deposition. The shadow mask may then be removed (together with portions of the seed layer thereon) to provide the structure of FIGS. 6c and 7c.

As shown in FIGS. 6d and 7d, the RDL 611 and bump pad 613 may be plated on the seed layer 607. More particularly, the RDL 611 and bump pad 613 may be plated using a catalytic/autocatalytic process and/or a substitutional process (such as an immersion process). For example, the RDL 611 and bump pad 613 may be plated using electroless-nickel/immersion-gold (ENIG). The RDL 611 and bump pad 613 may include a conduction layer (such as a layer of copper) on the seed layer 607, a barrier layer (such as a layer nickel) on the conduction layer, and a conductive passivation layer (such as a layer of gold) on the barrier layer. In an alternative, an organic solderability preservative may be provided as a passivation layer (instead of gold). The RDL passivation layer may be provided to protect against oxidation of the RDL 611 and bump pad 613. As used herein, the term RDL may be defined to include both the relatively narrow RDL 611 and the relatively wide bump pad 613. Moreover, compositions of the RDL 611 and bump pad 613 other than those discussed above may be used. For example, a conductive passivation layer may be omitted or a material other than gold may be provided as a conductive passivation layer.

In an alternative, before forming the seed layer, a shadow mask may be aligned over the protective layer 606 so that the shadow mask exposes portions of the protective layer 606 corresponding to the RDL and bump pad. Continuous layers of metal for the seed layer and for the RDL and bump pad may then be deposited on the exposed portions of the protective layer 606 and on the shadow mask, for example, using evaporation, sputtering, and/or chemical vapor deposition. The shadow mask may then be removed (together with portions of the metal for the seed layer, RDL, and bump pad thereon) to provide the structure of FIGS. 6*d* and 7*d*.

A preformed solder ball may then be placed on the bump pad 613 and subjected to a reflow operation to provide a solder bump 617 as shown in FIGS. 6*e* and 7*e*. By providing that a width of the RDL 611 is sufficiently less than a width of the bump pad 613, flow of solder down the RDL 611 during the reflow operation may be reduced and/or prevented. While preformed solder balls are discussed by way of example, any preformed solder mass may be used.

In addition or in an alternative, flux can be selectively applied to the bump pad 613 (without applying flux to the RDL 611 or portions thereof) before placing the preformed solder ball to reduce and/or prevent flow of solder down the RDL 611 during the reflow operation. By not providing flux on the RDL 611, a native oxide on the RDL 611 may be maintained on the RDL 611 during the reflow operation, and a non-wetting characteristic of the native oxide may reduce and/or prevent flow of solder thereon. Flux may be selectively applied to the bump pad 613, for example, using a flux stamp, printing, etc. In another alternative, solder may be formed on the RDL 611 and on the bump pad 613 (for example by plating), and the reflow operation may cause solder to flow from the RDL 611 to the bump pad 613. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from the RDL 611 to the bump pad 613.

The protective layer 606 of the process flow of FIGS. 6*a-e* and 7*a-e* may be provided to protect the passivation layer 605 and/or the wirebond pad 603 from chemicals used in subsequent processing steps. While polyimide is discussed above by way of example, other materials such as silicones, elastomers, flexibilized epoxies, thermosetting polymers, fluoropolymers, and/or thermoplastic polymers may be used for the protective layer 606. Other materials for protective layers are discussed, for example, in U.S. Pat. No. 6,211,572, the disclosure of which is hereby incorporated herein in its entirety by reference.

While not shown in the process flow of FIGS. 6*a-e* and 7*a-e*, the protective layer 606 may extend onto dicing streets between integrated circuit device die of a wafer (including a plurality of integrated circuit device die) to "seal" the passivation layer 605. More particularly, the passivation layer 605 may be removed from the dicing streets between the die so that the substrate 601 (or other material on the substrate) is exposed on the dicing streets between die before forming the protective layer 606.

According to some embodiments of the present invention, the protective layer 606 may extend onto portions of the dicing streets free of the passivation layer 605 surrounding each of the die without extending across the dicing streets. Central portions of the dicing streets through which the dicing saw will cut during subsequent dicing operations may be free of the protective layer 606 to reduce damage to the protective layer 606 when the wafer is diced to separate individual die. In other words, during a patterning step to expose portions of the wirebond pad 603 through the protective layer 606, portions of the protective layer 606 on central portions of the dicing streets may be removed while maintaining portions of the protective layer 606 on edge portions of the dicing streets that are free of the passivation layer 605. According to other embodiments of the present invention, the protective layer 606 may extend across the dicing streets between the die during dicing operations so that portions of the protective layer 606 in central portions of the dicing street are cut with the substrate 601.

Figure 8A:
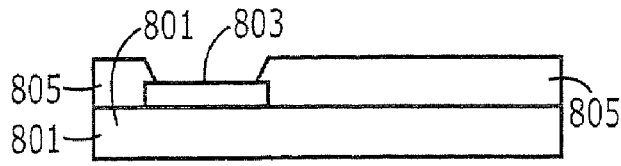
FIGS. 8a-d and 9a-d are cross sectional and corresponding plan views illustrating operations of forming solder structures according to yet other embodiments of the present invention.
Figure 9A:
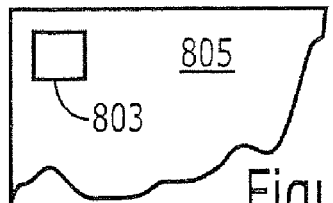
Figure 8B:
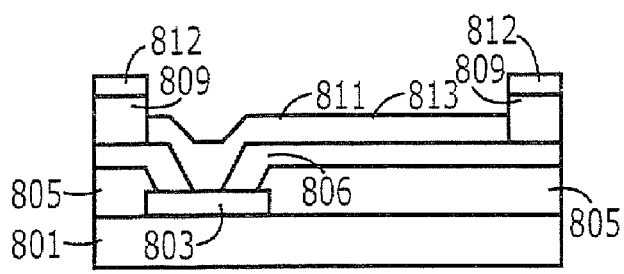
Figure 9B:
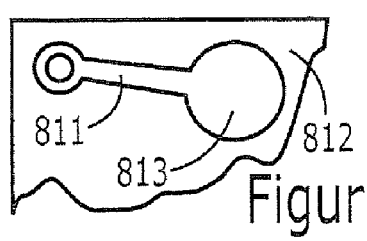

A process flow according to yet other embodiments of the present invention is discussed below with respect to the cross sectional views of FIGS. 8*a-d* and the corresponding plan views of FIGS. 9*a-d*. As shown in FIGS. 8*a* and 9*a*, an electronic device (such as an integrated circuit semiconductor device) may include a substrate 801 (such as a semiconductor substrate), a wirebond pad 803 (also referred to as an input/output pad), and an insulating passivation layer 805. As shown in FIGS. 8*b* and 9*b*, a protective layer 806 (such as a blanket layer of polyimide) may be deposited on the wirebond pad 803 and the passivation layer 805, and the protective layer 806 may be patterned to expose portions of the wirebond pad 803. While not shown in FIGS. 8*b* and 9*b*, the protective layer 806 may also be patterned to expose portions of dicing streets between integrated circuit devices on a manufacturing wafer.

As further shown in FIGS. 8*b* and 9*b*, a shadow mask 809 may be aligned over the protective layer 806 so that the shadow mask exposes portions of the protective layer 806 corresponding to the RDL and bump pad. In addition, layers of metal for the RDL and bump pad may then be deposited on the exposed portions of the protective layer 806 and on the shadow mask 809, for example, using evaporation, sputtering, and/or chemical vapor deposition. More particularly, portions of the metal layers on the protective layer 806 may define the RDL 811 and the bump pad 813, and excess metal 812 may be formed on the shadow mask 809.

The metal for the RDL 811 and bump pad 813 may include a seed/adhesion layer on the protective layer 806, a conduction layer (such as a layer of copper) on the seed/adhesion layer, a barrier layer (such as a layer of nickel) on the seed/adhesion layer, and a passivation layer (such as a layer of gold or an organic solderability preservative) on the barrier layer. The seed/adhesion layer may include a titanium-tungsten (TiW) layer on the protective layer 806 and a copper (Cu) layer on the titanium-tungsten layer. In an alternative, the seed/adhesion layer 807 may include a layer of aluminum on the protective layer 806, and layer of nickel vanadium (Ni:V) on the aluminum layer, and a layer of copper on the nickel vanadium layer. In still another alternative, the seed/adhesion layer may include a titanium tungsten (TiW) layer on the protective layer 806 and a nickel layer (Ni) on the titanium-tungsten layer. Moreover, compositions of the RDL 811 and bump pad 813 other than those discussed above may be used. For example, a conductive passivation layer may be omitted or a material other than gold may be provided as a conductive passivation layer.

Figure 8C:
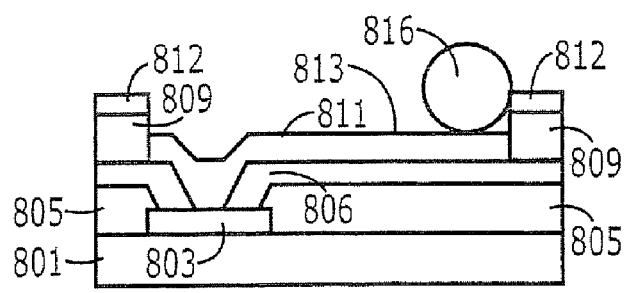
Figure 9C:
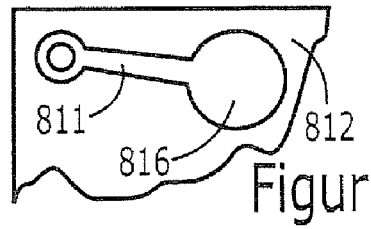

Flux can be selectively provided on the bump pad 813, and a preformed solder ball 816 may then be placed on the bump pad 813 (including the flux thereon) while maintaining the shadow mask 809 and the excess metal 812 thereon as shown in FIGS. 8*c* and 9*c*. The shadow mask 809 may thus provide a stencil for placement of the solder ball 816 because the portion of the opening in the shadow mask 809 over the bump pad 813 is significantly wider than the portion of the opening over the RDL 811. A preformed solder ball 813 with a diameter greater than a width of the RDL may thus fall selectively into the portion of the opening in the solder mask 809 exposing the bump pad 813. Accordingly, a single mask alignment (for the shadow mask 809) may be used both for RDL 811 and bump pad 813 patterning and for solder ball 816 placement. While a preformed solder ball is discussed by way of example, any preformed solder mass having a dimension greater than a width of the relatively narrow RDL may be used.

Figure 8D:
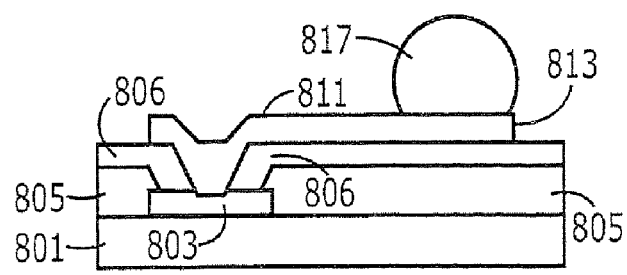
Figure 9D:
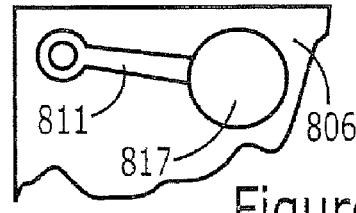

The solder ball 816 can be subjected to a reflow operation while maintaining the shadow mask 809 and the excess metal 812 thereon, and the shadow mask 809 and the excess metal 812 can then be removed to provide the solder bump 817 of FIGS. 8d and 9d. By selectively applying flux to the bump pad 813 (without applying flux to the RDL 811 or to the excess metal 812 or portions thereof) before placing the preformed solder ball 816, flow of solder onto the RDL 811 and/or the excess metal 812 can be reduced and/or eliminated during the reflow operation. By not providing flux on the RDL 811 and excess metal 812, a native oxide on the RDL 811 and excess metal 812 may be maintained during the reflow operation, and a non-wetting characteristic of the native oxide may reduce and/or prevent flow of solder thereon. Flux may be selectively applied to the bump pad 813, for example, using a flux stamp, printing, etc. In an alternative, the shadow mask 809 and the excess metal 812 thereon may be removed before performing the reflow operation, and a difference in widths of the bump pad 813 and the RDL 811 may be sufficient to reduce flow of solder down the RDL 811. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from the RDL 811 to the bump pad 813.

The protective layer 806 of the process flow of FIGS. 8a-d and 9a-d may be provided to protect the passivation layer 805 and/or the wirebond pad 803 from chemicals used in subsequent processing steps. While polyimide is discussed above by way of example, other materials such as silicones, elastomers, flexibilized epoxies, thermosetting polymers, fluoropolymers, and/or thermoplastic polymers may be used for the protective layer 806. Other materials for protective layers are discussed, for example, in U.S. Pat. No. 6,211,572, the disclosure of which is hereby incorporated herein in its entirety by reference.

While not shown in the process flow of FIGS. 8a-d and 9a-d, the protective layer 806 may extend onto dicing streets between integrated circuit device die of a wafer (including a plurality of integrated circuit device die) to "seal" the passivation layer 805. More particularly, the passivation layer 805 may be removed from the dicing streets between the die so that the substrate 801 (or other material on the substrate) is exposed on the dicing streets between die before forming the protective layer 806.

According to some embodiments of the present invention, the protective layer 806 may extend onto portions of the dicing streets free of the passivation layer 805 surrounding each of the die without extending across the dicing streets. Central portions of the dicing streets through which the dicing saw will cut during subsequent dicing operations may be free of the protective layer 806 to reduce damage to the protective layer 806 when the wafer is diced to separate individual die. In other words, during a patterning step to expose portions of the wirebond pad 803 through the protective layer 806, portions of the protective layer 806 on central portions of the dicing streets may be removed while maintaining portions of the protective layer 806 on edge portions of the dicing streets that are free of the passivation layer 805. According to other embodiments of the present invention, the protective layer 806 may extend across the dicing streets between the die during dicing operations so that portions of the protective layer 806 in central portions of the dicing street are cut with the substrate 801.

Figure 10A:
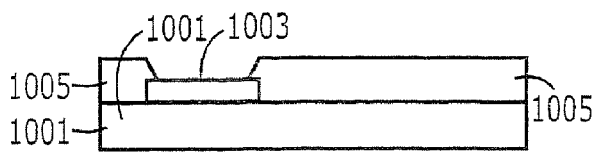
FIGS. 10a-e and 11a-e are cross sectional and corresponding plan views illustrating operations of forming solder structures according to more embodiments of the present invention.
Figure 11A:
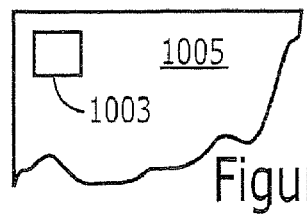
Figure 10B:
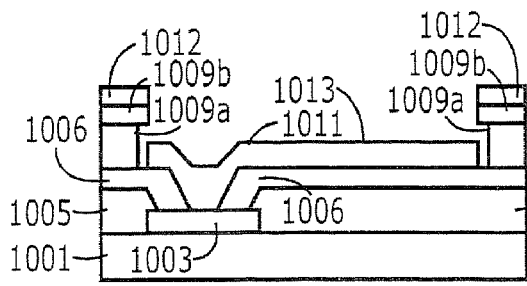
Figure 11B:
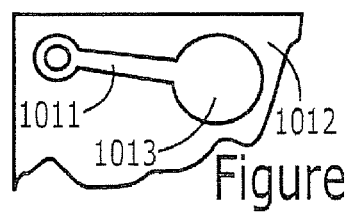

A process flow according to more embodiments of the present invention is discussed below with respect to the cross sectional views of FIGS. 10a-e and the corresponding plan views of FIGS. 11a-e. As shown in FIGS. 10a and 11a, an electronic device (such as an integrated circuit semiconductor device) may include a substrate 1001 (such as a semiconductor substrate), a wirebond pad 1003 (also referred to as an input/output pad), and an insulating passivation layer 1005. As shown in FIGS. 10b and 11b, a protective layer 1006 (such as a blanket layer of polyimide) may be deposited on the wirebond pad 1003 and the passivation layer 1005, and the protective layer 1006 may be patterned to expose portions of the wirebond pad 1003. While not shown in FIGS. 10b and 11b, the protective layer 1006 may also be patterned to expose portions of dicing streets between integrated circuit devices on a manufacturing wafer.

As further shown in FIGS. 10b and 11b, a shadow mask 1009a-b may be aligned over the protective layer 1006 so that the shadow mask exposes portions of the protective layer 1006 corresponding to the RDL and bump pad. In addition, layers of metal for the RDL and bump pad may then be deposited on the exposed portions of the protective layer 1006 and on the shadow mask 1009a-b, for example, using evaporation, sputtering, and/or chemical vapor deposition. More particularly, portions of the metal layers on the protective layer 1006 may define the RDL 1011 and the bump pad 1013, and excess metal 1012 may be formed on the shadow mask 1009a-b.

More particularly, the shadow mask may include first shadow mask layer 1009a and second shadow mask layer 1009b, and the two shadow mask layers may have different compositions (e.g., comprise different materials and/or concentrations thereof). The two shadow mask layers, for example, may have different concentrations of a chemical amplifier to provide different sensitivities to light. Chemical amplifiers are discussed, for example, in U.S. Pat. No. 5,595, 855, the disclosure of which is hereby incorporated herein in its entirety by reference. Accordingly, the two shadow mask layers may develop at different rates and/or the two shadow mask layers may be selectively stripped using different solutions. By providing that the shadow mask layers can be selectively stripped, the second shadow mask 1009b may be removed while maintaining the first shadow mask layer 1009a. By providing the that first shadow mask layer 1009a is more photosensitive than the second shadow mask layer 1009b, undercutting of the first shadow mask layer 1009a relative to the second shadow mask layer 1009b (i.e., so that edges of the second shadow mask layer 1009b extend beyond edges of the first shadow mask layer 1009a) may facilitate subsequent stripping of the second shadow mask layer. While not shown in FIG. 10b, portions of the excess metal 1012 may also extend on vertical edges of the second shadow mask layer 1009b.

Each of the shadow mask layers 1009a-b may be applied by spin coating and/or as a laminate sheet. According to some embodiments of the present invention, solid films of the two different shadow mask layers 1009a-b may be provided together as a laminated sheet that is then applied to the protective layer 1006. Once applied to the protective layer 1006, the shadow mask layers 1009a-b may be patterned using photolithographic exposure and develop steps.

The metal for the RDL 1011 and bump pad 1013 may include a seed/adhesion layer on the protective layer 1006, a conduction layer (such as a layer of copper) on the seed/adhesion layer, a barrier layer (such as a layer of nickel) on the seed/adhesion layer, and a passivation layer (such as a layer of gold or an organic solderability preservative) on the barrier layer. The seed/adhesion layer may include a titanium-tungsten (TiW) layer on the protective layer 1006 and a copper (Cu) layer on the titanium-tungsten layer. In an alternative, the seed/adhesion layer 1007 may include a layer of aluminum on the protective layer 1006, layer of nickel vanadium (Ni:V) on the aluminum layer, and a layer of copper on the nickel vanadium layer. In still another alternative, the seed/adhesion layer may include a titanium tungsten (TiW) layer on the protective layer 1006 and a nickel layer (Ni) on the titanium-tungsten layer. Moreover, compositions of the RDL 1011 and bump pad 1013 other than those discussed above may be used. For example, a conductive passivation layer may be omitted or a material other than gold may be provided as a conductive passivation layer.

Figure 10C:
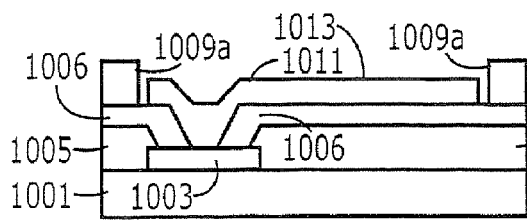
Figure 11C:
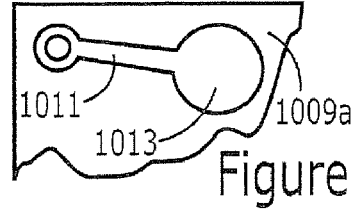

As shown in FIGS. 10c and 11c, the second shadow mask layer 1009b and the excess metal 1012 thereon may be selectively removed/stripped while maintaining the first shadow mask layer 1009a on the protective layer 1006. Stripping of the second shadow mask layer 1009b may be facilitated by providing that the first shadow mask layer 1009a is undercut relative to the second shadow mask layer 1009b so that exposure of the second shadow mask layer 1009b to a stripping solution is increased.

Figure 10D:
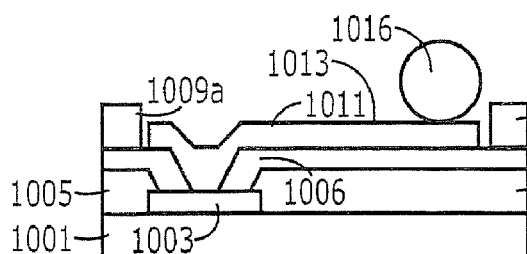
Figure 11D:
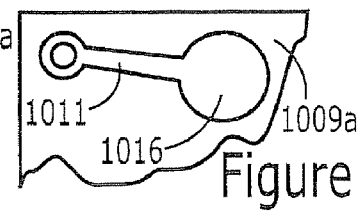

A preformed solder ball 1016 may then be placed on the bump pad 1013 while maintaining the first shadow mask layer 1009a as shown in FIGS. 10d and 11d. The first shadow mask layer 1009a may thus provide a stencil for placement of the solder ball 1016 because the portion of the opening in the first shadow mask layer 1009a over the bump pad 1013 is significantly wider than the portion of the opening over the RDL 1011. A solder ball 1016 with a diameter greater than a width of the RDL may thus fall selectively into the portion of the opening in the first shadow mask layer 1009a exposing the bump pad 1013. Accordingly, a single mask alignment (for the shadow mask 1009a-b) may be used both for RDL 1011 and bump pad 1013 patterning and for solder ball 1016 placement. As used herein, the term RDL may be defined to include both the relatively narrow RDL 1011 and the relatively wide bump pad 1013. While a preformed solder ball is discussed by way of example, any preformed solder mass having a dimension greater than a width of the relatively narrow RDL may be used.

Figure 10E:
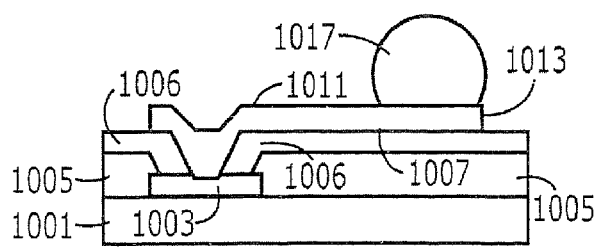
Figure 11E:
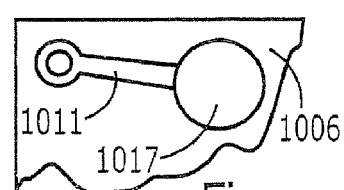

The solder ball 1016 can be subjected to a reflow operation while maintaining the first shadow mask layer 1009a, and the first shadow mask layer 1009a can then be removed to provide the solder bump 1017 of FIGS. 10e and 11e. In an alternative, the first shadow mask layer 1009a may be maintained after reflowing the solder ball 1016. A difference in widths of the bump pad 1013 and the RDL 1011 may be sufficient to reduce flow of solder down the RDL 1011. In addition, flux may be selectively applied to the bump pad 1013 (without applying flux to the RDL 1011 or portions thereof) before placing the preformed solder ball 1016, to further reduce and/or eliminate flow of solder onto the RDL 1011. By not providing flux on the RDL 1011, a native oxide on the RDL 1101 may be maintained during the reflow operation, and a non-wetting characteristic of the native oxide may reduce and/or prevent flow of solder thereon. Flux may be selectively applied to the bump pad 1013, for example, using a flux stamp, printing, etc. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from the RDL 1011 to the bump pad 1013.

The protective layer 1006 of the process flow of FIGS. 10a-e and 11a-e may be provided to protect the passivation layer 1005 and/or the wirebond pad 1003 from chemicals used in subsequent processing steps. While polyimide is discussed above by way of example, other materials such as silicones, elastomers, flexibilized epoxies, thermosetting polymers, fluoropolymers, and/or thermoplastic polymers may be used for the protective layer 1006. Other materials for protective layers are discussed, for example, in U.S. Pat. No. 6,211,572, the disclosure of which is hereby incorporated herein in its entirety by reference.

While not shown in the process flow of FIGS. 10a-e and 11a-e, the protective layer 1006 may extend onto dicing streets between integrated circuit device die of a wafer (including a plurality of integrated circuit device die) to "seal" the passivation layer 1005. More particularly, the passivation layer 1005 may be removed from the dicing streets between the die so that the substrate 1001 (or other material on the substrate) is exposed on the dicing streets between die before forming the protective layer 1006.

According to some embodiments of the present invention, the protective layer 1006 may extend onto portions of the dicing streets free of the passivation layer 1005 surrounding each of the die without extending across the dicing streets. Central portions of the dicing streets through which the dicing saw will cut during subsequent dicing operations may be free of the protective layer 1006 to reduce damage to the protective layer 1006 when the wafer is diced to separate individual die. In other words, during a patterning step to expose portions of the wirebond pad 1003 through the protective layer 1006, portions of the protective layer 1006 on central portions of the dicing streets may be removed while maintaining portions of the protective layer 1006 on edge portions of the dicing streets that are free of the passivation layer 1005. According to other embodiments of the present invention, the protective layer 1006 may extend across the dicing streets between the die during dicing operations so that portions of the protective layer 1006 in central portions of the dicing street are cut with the substrate 1001.

A process flow according to some more embodiments of the present invention is discussed below with respect to the cross sectional views of FIGS. 12a-h and the corresponding plan views of FIGS. 13a-h. As shown in FIGS. 12a and 13a, an electronic device (such as an integrated circuit semiconductor device) may include a substrate 1201 (such as a semiconductor substrate), a wirebond pad 1203 (also referred to as an input/output pad), and an insulating passivation layer 1205. As shown in FIGS. 12b and 13b, a compliant dielectric layer 1204 (such as a polymer dielectric layer) may be selectively formed on portions of the insulating passivation layer 1205, for example, using screen printing and/or liquid jetting, so that a photolithographic patterning operation is not required. If the compliant dielectric layer 1204 is not used to protect the wirebond pad 1203 as a solder mask or dam, the compliant dielectric layer 1204 may be deposited only where it is to be used to provide compliance (e.g., where a solder bump will be formed).

By way of example, the compliant dielectric layer 1204 may be a layer of silicone rubber (such as a room temperature vulcanizing (RTV) silicone rubber) formed by stencil printing. A mound of silicone rubber may be deposited at a site for a subsequently formed solder bump. If the compliant dielectric layer 1204 is not used to cover and expose different portions of the wirebond pad 1203, fine feature printing of the compliant dielectric layer 1204 may not be required. Moreover, the compliant dielectric layer 1204 may be printed onto a central portion of the die to avoid an outer ring of wirebond pads.

As shown in FIGS. 12*c* and 13*c*, a seed layer 1207 may be formed (for example, using sputtering) on the passivation layer 1205, on exposed portions of the wirebond pad 1203, and on the compliant dielectric layer 1204. The seed layer 1207 may include an adhesion layer (such as a layer of titanium-tungsten TiW) on the passivation layer 1205 and on the compliant dielectric layer 1204 and a conduction layer (such as a layer of copper Cu) on the adhesion layer. In an alternative, the seed layer 1207 may include a layer of aluminum on the passivation layer 1205 and on the compliant dielectric layer 1204, and layer of nickel vanadium (Ni:V) on the aluminum layer, and a layer of copper on the nickel vanadium layer.

As shown in FIGS. 12*d* and 13*d*, a patterned photoresist layer 1209 (or other masking layer) may be formed on the seed layer 1207, and the patterned photoresist layer 1209 may expose portions seed layer 1207 on which an RDL line and bump pad will be plated. Stated in other words, the patterned photoresist layer 1209 may provide a plating template to plate an RDL line and bump pad. Moreover, the patterned photoresist layer 1209 may be formed using photolithographic coat, expose, and develop operations.

As shown in FIGS. 12*e* and 13*e*, the RDL 1211 and bump pad 1213 may be plated on portions of the seed layer 1207 exposed through the photoresist layer 1209, and the photoresist layer 1209 may be removed as shown in FIGS. 12*f* and 13*f*. More particularly, the RDL 1211 and bump pad 1213 may include a conduction layer (such as a layer of copper) on the seed layer 1207, a barrier layer (such as a layer nickel) on the conduction layer, and a conductive passivation layer (such as a layer of gold) on the barrier layer. In an alternative, an organic solderability preservative may be provided as a passivation layer (instead of gold). The RDL passivation layer may be provided to protect against oxidation of the RDL 1211 and bump pad 1213. As used herein, the term RDL may be defined to include both the relatively narrow RDL 1211 and the relatively wide bump pad 1213. Moreover, compositions of the RDL 1211 and bump pad 1213 other than those discussed above may be used. For example, a conductive passivation layer may be omitted or a material other than gold may be provided as a conductive passivation layer.

Portions of the seed layer 1207 not covered by the RDL 1211 and/or the bump pad 1213 may be removed, for example, using a chemical etch, as shown in FIGS. 12*g* and 13*g*. A preformed solder ball may then be placed on the bump pad 1213 and subjected to a reflow operation to provide a solder bump 1217 as shown in FIGS. 12*h* and 13*h*. By providing that a width of the RDL 1211 is sufficiently less than a width of the bump pad 1213, flow of solder down the RDL 1211 during the reflow operation may be reduced and/or prevented. While preformed solder balls are discussed by way of example, any preformed solder mass may be used.

In addition or in an alternative, flux can be selectively applied to the bump pad 1213 (without applying flux to the RDL 1211 or portions thereof) before placing the preformed solder ball to reduce and/or prevent flow of solder down the RDL 1211 during the reflow operation. By not providing flux on the RDL 1211, a native oxide on the RDL 1211 may be maintained on the RDL 1211 during the reflow operation, and a non-wetting characteristic of the native oxide may reduce and/or prevent flow of solder thereon. Flux may be selectively applied to the bump pad 1213, for example, using a flux stamp, printing, etc. In another alternative, solder may be plated on the RDL 1211 and the bump pad 1213 before removing the patterned photoresist layer 1209, and the reflow operation may cause solder to flow from the RDL 1211 to the bump pad 1213. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from the RDL 1211 to the bump pad 1213.

As discussed above with respect to FIGS. 12*c*-12*h* and 13*a*-13*h*, the seed layer 1207, RDL 1211 and bump pad 1213 may be formed on the wirebond pad 1203, insulating passivation layer 1205, and compliant dielectric layer 1204 using steps similar to those discussed above with respect to FIGS. 2*b*-2*g* and 3*b*-3*g*. In alternatives, the seed layer 1207, RDL 1211 and bump pad 1213 may be formed using steps similar to those discussed above with respect to FIGS. 4*c*-*h* and 5*c*-*h*, FIGS. 6*b*-*e* and 7*b*-*e*, FIGS. 8*b*-*d* and 9*b*-*d*, and FIGS. 10*b*-*e* and 11*b*-*e*. Moreover, a protective layer (as discussed above with respect to FIGS. 4*b* and 5*b*, FIGS. 6*b* and 7*b*, FIGS. 8*b* and 9*b*, FIGS. 10*b* and 11*b*) may also be provided between the compliant dielectric layer 1204 and the insulating passivation layer 1205. Such a protective layer may also be provided between portions of the wirebond pad 1203 and the seed layer 1207.

By forming the compliant dielectric layer 1204, the RDL 1211, the bump pad 1213, and the solder bump 1217 as discussed above with respect to FIGS. 12*a*-*h* and 13*a*-*h*, a number of photolithography steps may be reduced as compared to a conventional 4-mask Redistribution Line (RDL) Chip Scale Package (CSP). Moreover, the RDL 1211 and bump pad 1213 may be capped with a UBM (e.g., Ni and/or Au) to protect the conductor layer (e.g., Cu) of the RDL 1211 and bump pad 1213 by providing protection from moisture and/or corrosive agents in the environment. In an alternative, the conductor layer (e.g., Cu) of the RDL 1211 and bump pad 1213 may be left bare if the system package provides adequate protection, and UBM is not otherwise required.

By providing that the RDL 1211 is sufficiently narrower than the bump pad 1213, and/or by selectively providing flux on the bump pad 1213 (and not on the RDL 1211 or portions thereof) flow of solder onto the RDL 1211 may be reduced and/or prevented. Accordingly, the RDL 1211 and/or UBM on the RDL 1211 may be completely exposed and not covered by a dielectric.

By providing that solder bump 1217 is laterally spaced apart from the via in the insulating passivation layer 1205 exposing portions of the wirebond pad 1203 (so that the wirebond pad 1203 is not under the solder bump 1217), the solder bump may rest on a relatively flat bump pad 1213 thereby improving stress/strain distribution. By providing a relatively flat bump pad 1213, current distribution and thus electromigration lifetime may be improved. The RDL line 1211 may also define a passive electrical element such as a resistor, a planar inductor coil, and/or one or more plates of a capacitor.

Moreover, some solder bumps may be provided on the compliant dielectric layer 1204 while other solder bumps are provided on portions of the insulating passivation layer 1205 without the compliant dielectric layer 1204. More particularly, solder bumps closer to an edge of the substrate 1201 may be provided on the compliant dielectric layer because these solder bumps may be subjected to greater stress/strain and the compliant dielectric layer may absorb some of this stress/strain. Solder bumps closer to a center of the substrate 1201 may be provided without the compliant dielectric layer 1201 because these solder bumps may be subjected to less stress/strain. Moreover, solder bumps without the compliant dielectric layer may provide a more rigid attachment to another substrate (such as a printed circuit board).

A protective polyimide layer (shown as protective layers 406, 606, 806, 1006 in FIGS. 4*b*, 5*b*, 6*b*, 7*b*, 8*b*, 9*b*, 10*b*, and 11*b*) may be omitted (as shown in FIGS. 2*a*-*g* and 3*a*-*g* and FIGS. 12*a*-*h* and 13*a*-*h*). More particularly, a TiW barrier layer of the seed layer 1207 can be etched with chemicals that are relatively gentle with respect to an aluminum wirebond pad 1203 and with respect to a glass passivation layer 1205, so that the aluminum wirebond pad 1203 (or portions thereof) and the glass passivation layer 1205 (or portions thereof) can be exposed during the final etch and so that a polyimide layer is not required to reduce a size of an exposed portion of the wirebond pad 1203.

Because solder flow on the RDL 1211 can be reduced and/or prevented by providing a difference in width between a portion of the RDL 1211 contacting the bump pad 1213 and/or by selectively providing flux on the bump pad 1213, a size of a capture pad portion of the RDL 1211 covering the aluminum wirebond pad 1203 may not need to be small (to provide solder pressure control) and can be any convenient size. Accordingly, the RDL 1211 may include a relatively large capture pad portion that completely seals the aluminum wirebond pad 1203.

A conduction layer (e.g., copper) of the RDL 1211 and bump pad 1213 can be made relatively thick, for example, greater than about 0.5 μm (micrometers) to improve current distribution under the bump. Relatively thick conduction layers are discussed, for example, in U.S. Pat. No. 6,960,828 and in U.S. patent application Ser. No. 11/270,366, the disclosures of which are hereby incorporated herein in their entirety by reference. Moreover, multiple relatively narrow RDL lines may be connected to a pad to reduce resistance and/or increase current carrying capacity.

In the process flows illustrated in FIGS. 2*a*-*g* and 3*a*-*g*, in FIGS. 4*a*-*h* and 5*a*-*h*, in FIGS. 6*a*-*h* and 7*a*-*h*, in FIGS. 8*a*-*d* and 9*a*-*d*, in FIGS. 10*a*-10*e* and 11*a*-11*e*, or in FIGS. 12*a*-12*h* and 13*a*-13*h*, operations of forming the solder bumps 217, 417, 617, 817, 1017, or 1217, may be performed by placing a solid preformed solder mass (e.g., a solder or sphere) on the bump pad (213, 413, 613, 813, 1013, or 1213). Moreover, placing the solid preformed solder mass may be preceded by selectively providing flux on the bump pad (213, 413, 613, 813, 1013, or 1213) while maintaining exposed portions of the RDL line (211, 411, 611, 811, 1011, or 1211) free of the flux. During reflow of the solder, an oxide of the metal on the bump pad (213, 413, 613, 813, 1013, or 1213) may thus be chemically reduced while the oxide of the metal on portions of the RDL line (211, 411, 611, 811, 1011, or 1211) may be maintained. Accordingly, wetting of the solder to the bump pad (213, 413, 613, 813, 1013, or 1213) can be enhanced while wetting of the solder to the RDL line (211, 411, 611, 811, 1011, or 1211) during reflow can be reduced so that the solder is maintained on the bump pad without requiring formation and/or patterning of a layer or dam on the RDL line. The oxide of the RDL metal, for example, may occur as a result of exposure of the RDL metal to oxygen in the atmosphere.

If adhesion of metal of the RDL 1211 and bump pad 1213 to the underlying compliant dielectric layer 1204 is made less than a yield strength of the weakest part of the force-bearing structure, portions of the RDL 1211 and bump pad 1213 may shear free from the compliant dielectric layer 1204 allowing the solder bump 1217, the bump pad 1213, and portions of the RDL 1211 to 'float' relative to the substrate 1201 (also referred to as a die). Adhesion of metal of the RDL 1211 to the wirebond pad 1203 may be greater than the resulting applied force and the RDL 1211 may provide compliance along its length (for example by providing a curve along a length of the RDL 1211) to absorb a stress/strain of motion of the solder bump 1217 (at an end of the RDL 1211) relative to the substrate 1201. Cantilevered RDL stress/strain relief structures are discussed in greater detail below.

An RDL that adheres poorly to a final dielectric layer on which it is formed can be made to detach from the dielectric layer under conditions of high stress/strain (for example, due to differences in thermal expansion of two substrates between which a solder bump is attached). The detached RDL may then be allowed to 'float', so that stress/strain on a solder bump at a floating end of the RDL may be reduced. The RDL line may be attached to the die at one end only at the via to the wirebond pad, such that the bump is on a cantilevered arm that allows small displacements with reduced stress/strain on the solder bump. Stress/strain may be absorbed by the RDL which distributes the stress/strain over a much longer distance. Since the die and substrate may be rigidly bonded by other low-DNP (distance to neutral point) solder bumps, a stress/strain imparted on the "floating" RDL may be reduced. In other words, solder bumps on a die at a relatively small distance from a neutral point of stress/strain may provide a rigid mechanical connection between the die and another substrate, while solder bumps on the die at a relatively large distance from the neutral point of stress/strain may be flexibly coupled to the die through a "floating" RDL to reduce stress/strain.

A cyclic thermal fatigue lifetime of a flip chip solder joint may depend on the distance-to-neutral point (DNP) raised to an exponent of nearly two. For a given reliability requirement, the DNP for each solder bump on the die may need to be less than some critical value. Where it is desired to place a solder bump at a DNP larger than the critical value, reduction and/or elimination of stress/strain for these high DNP bumps may be needed.

Figure 14A:
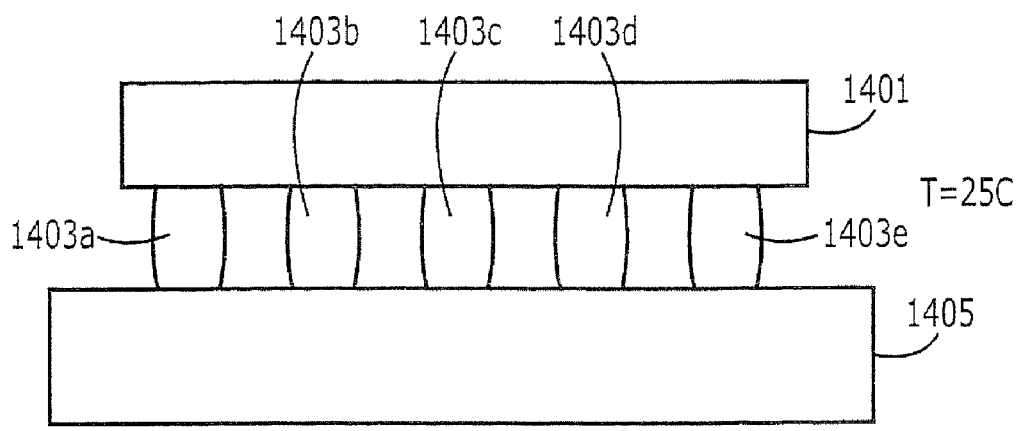
FIGS. 14a-c are cross sectional views illustrating stresses/strains on solder bumps resulting from differences in thermal expansion in electronic assemblies according to embodiments of the present invention.
Figure 14B:
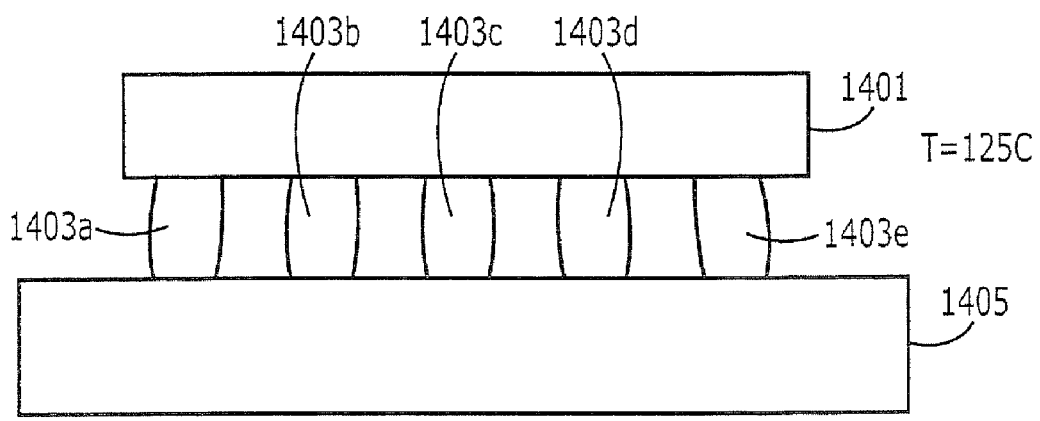
Figure 14C:
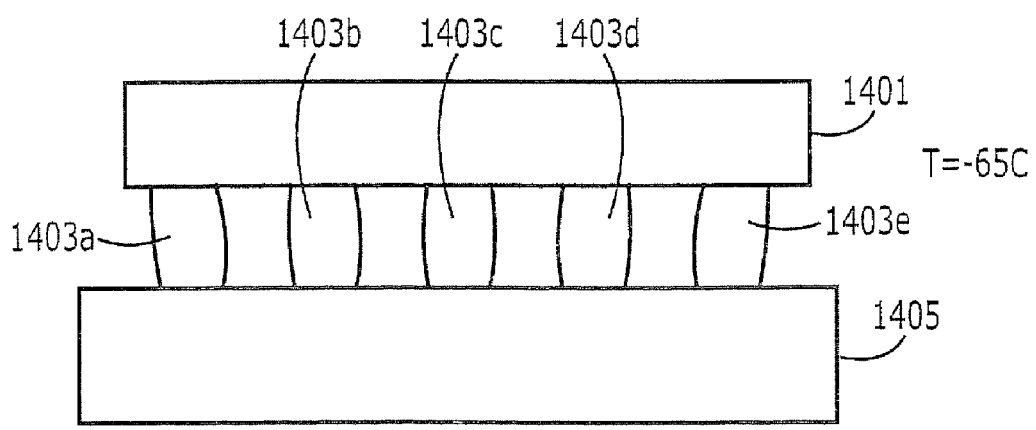

As shown in FIGS. 14*a*-*c*, a semiconductor integrated circuit (IC) device 1401 (also referred to as a die) may be electrically and mechanically coupled to a substrate 1405 (such as a printed circuit board) using a plurality of solder bumps 1403*a*-*e*. At room temperature, bump pads of the IC device 1401 and the substrate 1405 may be substantially aligned so that lateral stresses/strains on the solder bumps 1403*a*-*e* may be relatively small as shown in FIG. 14*a*. As the assembly is heated, however, the substrate 1405 may expand relative to the IC device 1401 as shown in FIG. 14*b*. As the assembly is cooled, the substrate 1405 may contract relative to the IC device 1401 as shown in FIG. 14*c*. The central solder bump 1403*c* (located at the neutral point of thermal expansion) is thus subject to relatively little lateral stress/strain as the assembly is heated and/or cooled. Other solder bumps with greater distances to the neutral point of thermal expansion, however, may be subjected lateral stresses/strains as the assembly is heated and cooled. More particularly, the outer solder bumps 1403*a* and 1403*e* may be subjected to greater lateral stresses/strains than intermediate solder bumps 1403*b* and 1403*d*.

Figure 15A:
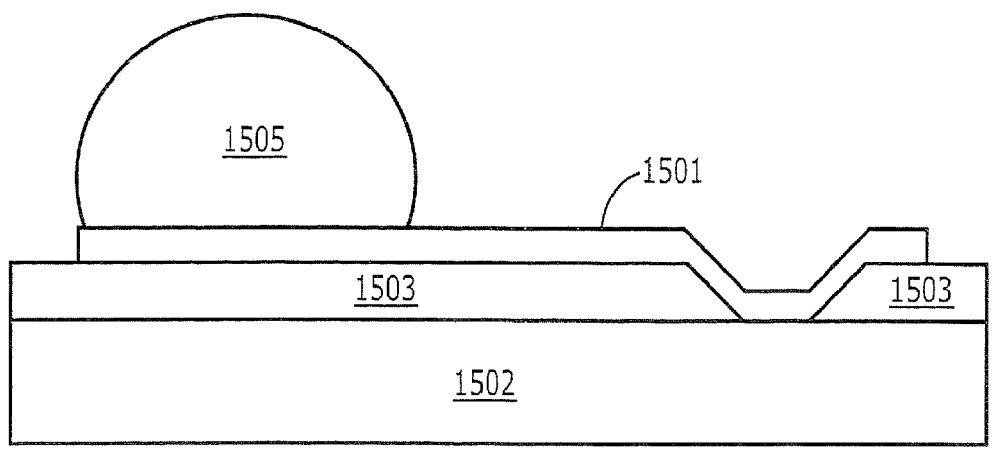
FIGS. 15a and 15b are corresponding plan and cross sectional views illustrating a curved redistribution line (RDL) according to embodiments of the present invention.
Figure 15B:
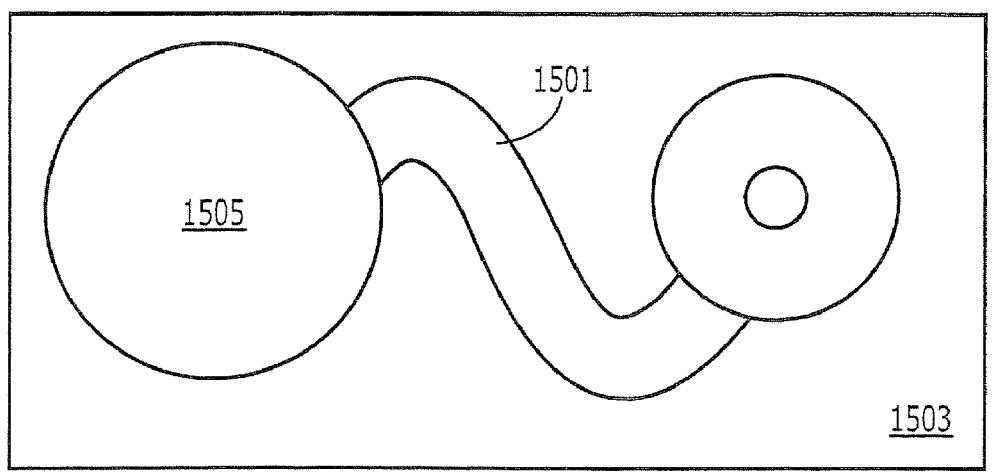

Some metals do not adhere well to some polymer dielectrics unless the polymer dielectric is pretreated, for example, using a plasma roughening. If the pretreatment is reduced and/or eliminated, low adhesion between an RDL and the underlying polymer dielectric may result. According to some embodiments of the present invention shown in FIGS. 15a-c, an RDL 1501 for a high DNP bump 1505 on IC device substrate 1502 may be formed on a final passivation layer 1503 (such as a polymer dielectric layer) with adhesion sufficient to provide robustness during processing, testing, handling, and assembly, yet with adhesion low enough to allow release after coupling to another substrate (such as a printed circuit board) under stress/strain in the assembly due to differences of thermal expansion. If the RDL 1501 is not self-passivating, protection may be provided using a suitable coating such as electroless gold.

After assembly, a difference of expansivity between the IC device substrate 1502 and the other substrate (such as a printed circuit board) to which the high DNP bump 1505 is attached may cause lateral stresses/strains to be applied to the solder bump 1505 and the metal RDL 1501 that exceed an adhesive strength of an interface between the final passivation layer 1503 and the RDL 1501 so that the RDL 1501 separates from the final passivation layer 1503. Excessive stress/strain to these "floating" lines may be reduced by providing that the IC device is firmly held to the other substrate by other relatively low-DNP solder bumps.

For example, in a Chip Scale Package (CSP) on an organic substrate with 0.2 mm tall bumps in a full area array with a maximum DNP of 5 mm, a total strain at 125 degrees C. can exceed 2.25% for corner solder bumps. A critical elastic strain limit for high lead solder may be about 0.02% so that the corner bumps may be well into a plastic strain region. Because fatigue life decreases as the square of plastic strain, a significant improvement in reliability may be provided if highest DNP bumps are provided with stress/strain relief. If strain on bumps outside a 3.5 mm radius from the neutral point is relieved, thermal cycle fatigue life may increase on the order of 100%. In this example based on a circular array geometry, 96% of the bumps may be provided with standard vias and RDL lines and 4% may be provide with "floating" RDL lines to reduce stress/strain.

Figure 15C:
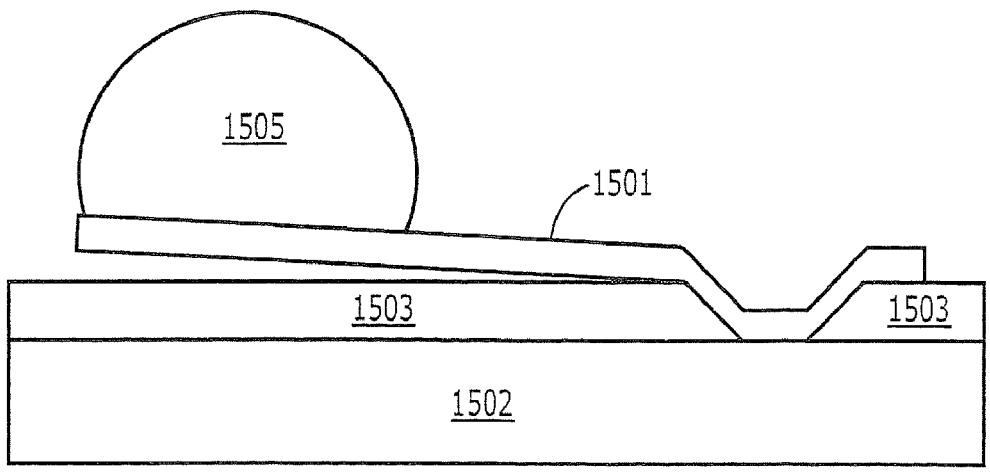
FIG. 15c is a cross sectional view illustrating a floating RDL and solder bump according to embodiments of the present invention.
Figure 16A:
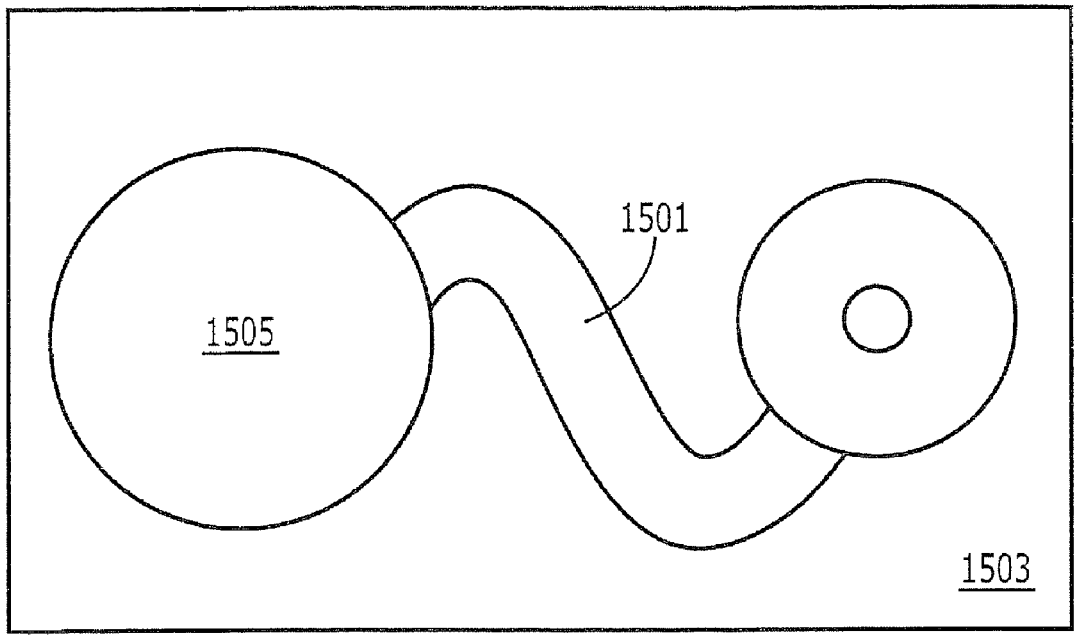
FIGS. 16a and 16b are plan views illustrating expansion and contraction of a curved RDL according to embodiments of the present invention.
Figure 16B:
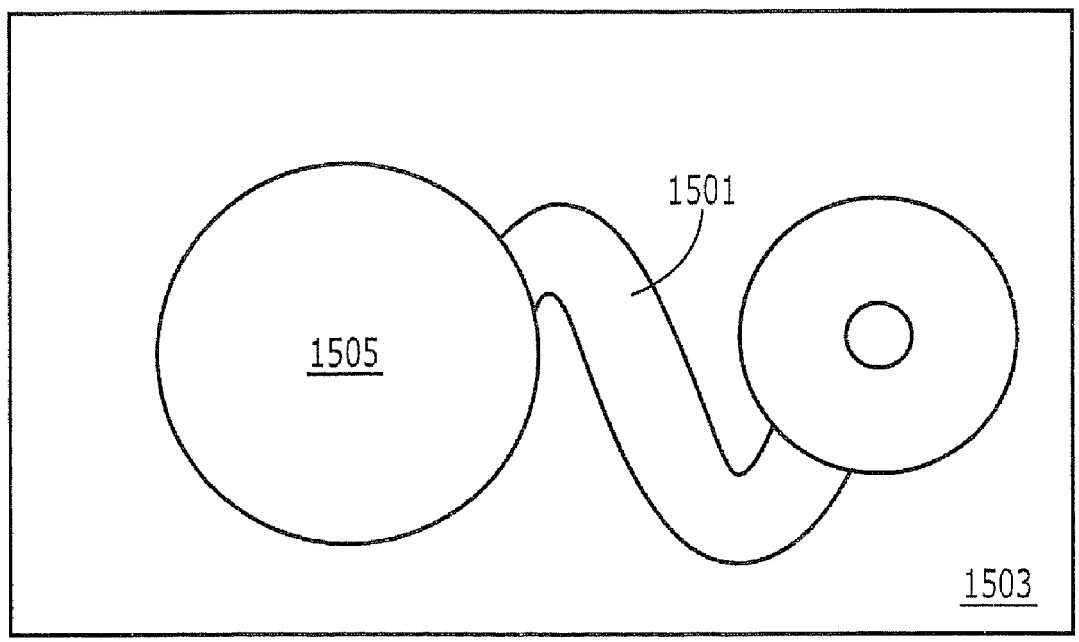

Once the RDL 1501 has released from the final passivation layer 1503 as shown in FIG. 15c, the curved RDL 1501 may stretch and/or compress to accommodate lateral displacements of the substrate to which the integrated circuit device substrate 1502 is attached as shown in FIGS. 16a-b.

According to additional embodiments of the present invention, solder bumps most distant from a neutral point of thermal expansion of an IC device substrate may be provided on a compliant dielectric layer while solder bumps closest to the neutral point of thermal expansion may be provided on a relatively rigid dielectric layer. The solder bumps on the relatively rigid dielectric layer may thus provide a relatively rigid coupling between the IC device substrate and another substrate (such as a printed circuit board), while the compliant dielectric layer may reduce lateral stress/strain on the solder bumps most distant form the neutral point of thermal expansion.

Figure 17A:
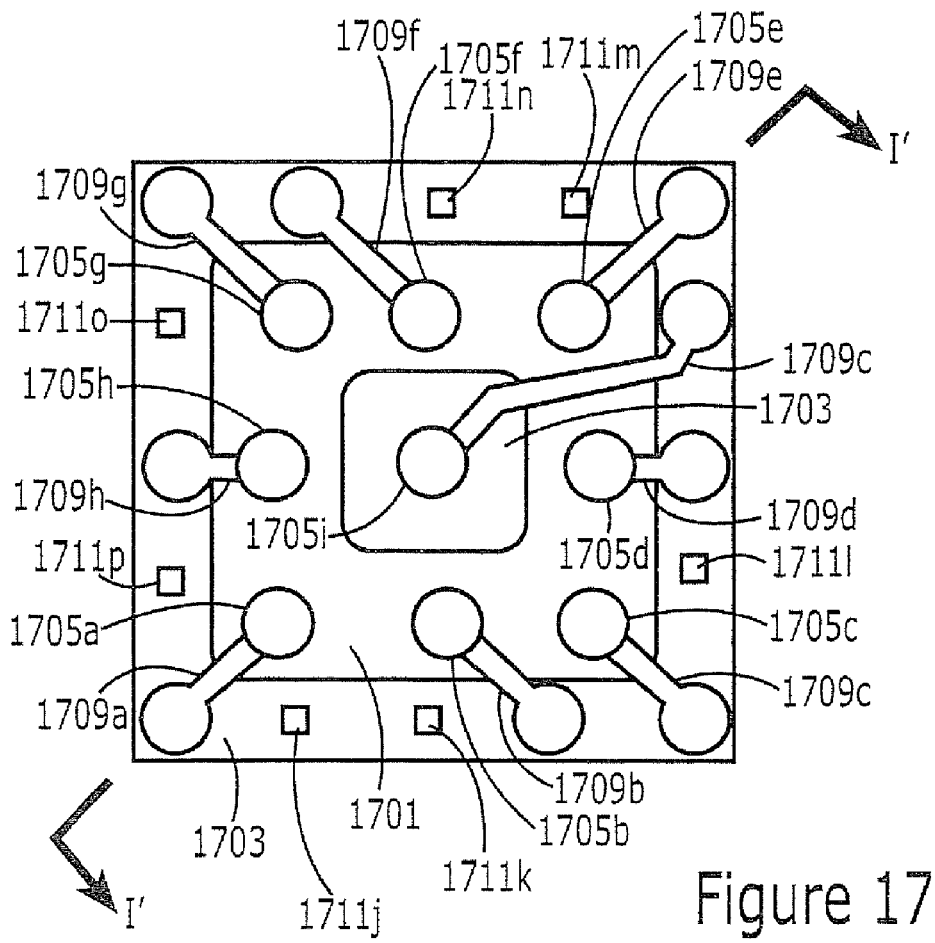
FIG. 17a is a plan view of a an integrated circuit device including RDLs and solder bumps according to embodiments of the present invention.
Figure 17B:
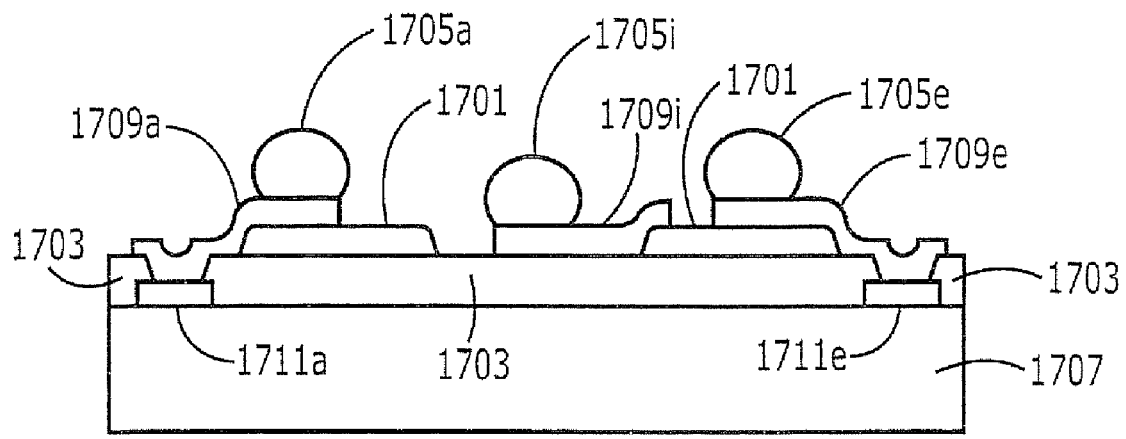
FIG. 17b is a cross sectional view taken along line I-I' of FIG. 17a according to embodiments of the present invention.

As shown in the plan view of FIG. 17a and the corresponding cross sectional view of FIG. 17b, a compliant dielectric layer 1701 may be provided between some of the solder bumps (e.g., solder bumps 1705a-h) and the insulating passivation layer 1703 but not others (e.g., solder bump 1705i). More particularly, wirebond pads 1711 may be provided around a periphery of the integrated circuit device substrate 1707, and holes in the insulating passivation layer 1703 may expose portions of the wirebond pads 1711. Moreover, RDLs 1709a-i may provide electrical coupling between respective wirebond pads 1711a-i and solder bumps 1705a-i. As shown in FIG. 17a, other unused wirebond pads 1711j-p may be exposed through vias in the insulating passivation layer 1703. As used herein, the term RDL may be defined to include bump pads (i.e., widened portions of the RDL) on which the respective solder bumps will be provided and/or to include capture pads on the respective wirebond pads.

The insulating passivation layer 1703 and the compliant dielectric layer 1701 may comprise different materials, and the insulating passivation layer 1703 may be more rigid than the compliant dielectric layer 1701. In addition or in an alternative, adhesion between the insulating passivation layer 1703 and the RDLs 1709a-i may be greater than adhesion between compliant dielectric layer 1701 and the RDLs 1709a-i. Accordingly, the peripheral solder bumps 1705a-h and associated RDLs 1709a-h may float as discussed above with respect to FIG. 15c to reduce stress/strain resulting from thermal expansion, while the central solder bump 1705i and RDL 1709i may remain secured to the insulating passivation layer 1703.

While only one solder bump 1705i is shown on the central portion of the insulating passivation layer 1703 that is free of the compliant dielectric layer 1701, a plurality of solder bumps could be provided on the central portion of the insulating passivation layer 1703. By providing that one or more solder bumps on a central portion of the substrate 1707 are more tightly coupled to the substrate 1707, the central solder bump(s) may support connection of the IC substrate 1707 to another substrate (such as a printed circuit board) in an electronic assembly against forces resulting, for example, from dropping, bending, shearing, and/or impact. Accordingly, reliability of the electronic assembly may be increased.

The RDLs 1709a-i and solder bumps 1705a-i may be formed as discussed above with respect to FIGS. 2a-g and 3a-g, FIGS. 4a-h and 5a-h, FIGS. 6a-e and 7a-e, FIGS. 8a-d and 9a-d, FIGS. 10a-e and 11a-e, and/or FIGS. 12a-h and 13a-h. The compliant dielectric layer 1701 may be formed as discussed above with respect to FIGS. 12a-h and 13a-h. The compliant dielectric layer 1701, for example, may be a layer including a silicone, an elastomer, a polyimide, a flexibilized epoxy, a thermosetting polymer, a fluoropolymer, and/or a thermoplastic polymer, and/or other compliant material, and the compliant dielectric layer 1701 may be selectively formed and/or printed (for example, using stencil printing, needle dispense, pad printing, etc.) so that a separate photolithographic masking step is not required and so that cost may be reduced. The insulating passivation layer 1703 may include a layer of an inorganic material such as silicon oxide, silicon nitride, and/or silicon oxynitride, or the insulating layer may be a layer of polyimide. If a polyimide layer is used as the insulating passivation layer 1703, the insulating passivation layer 1703 may be subjected to a surface treatment (such as a roughening) to promote adhesion between the RDLs and the insulating passivation layer 1703, while a surface of the compliant dielectric layer 1701 may remain untreated to reduce adhesion between the RDLs and the compliant dielectric layer 1701.

Figure 18A:
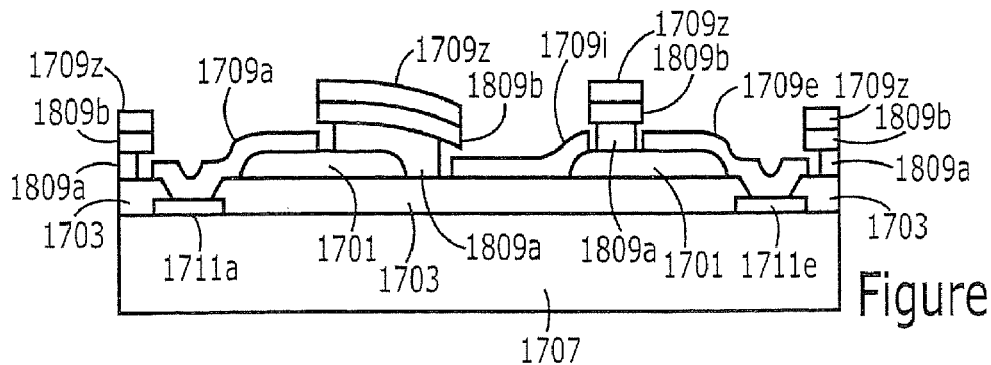
FIGS. 18a-d are cross sectional views illustrating steps of forming electrical and mechanical interconnections according to embodiments of the present invention.
Figure 18B:
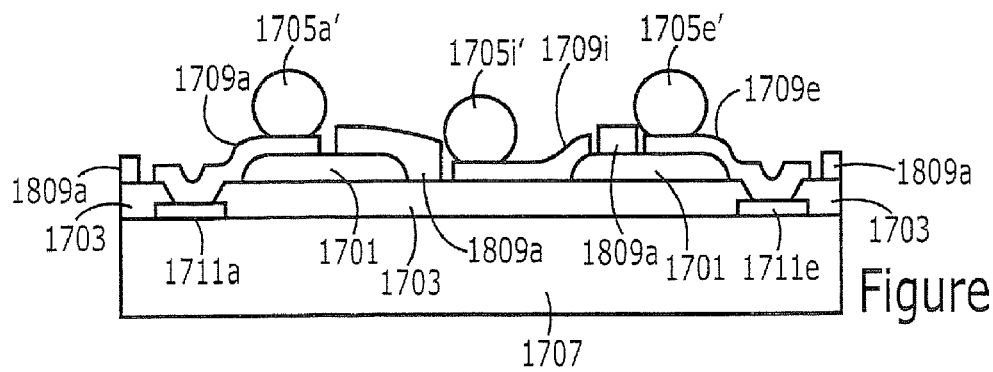
Figure 18C:
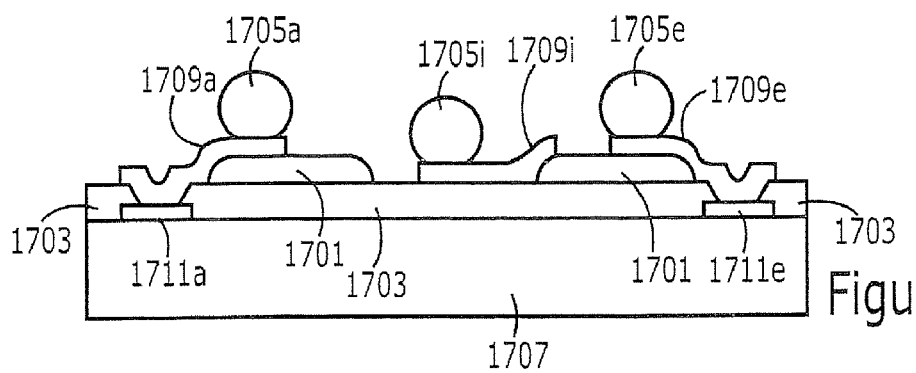

FIGS. 18a-c are cross sectional views illustrating operations of forming the RDLs and solder bumps of FIGS. 17a-b. As shown in FIG. 18a, a semiconductor device may include a semiconductor substrate 1707, a plurality of wirebond pads 1711a and 1711e (also referred to as an input/output pads), and an insulating passivation layer 1703. In addition, a compliant dielectric layer 1701 (such as a layer of a polymer dielectric, a silicone, an elastomer, a polyimide, or other compliant material) may be selectively formed on portions of the insulating passivation layer 1703 (for example, using screen printing, liquid jetting, needle dispense, pad printing, etc.) so that a photolithographic patterning operation is not required. More particularly, the compliant dielectric layer 1701 may be selectively formed outside a central region of the IC substrate 1707.

By way of example, the compliant dielectric layer 1701 may be a layer of silicone rubber (such as a room temperature vulcanizing RTV silicon rubber) formed by stencil printing. A mound of silicon rubber may be deposited at a site for a subsequently formed solder bump. Because the compliant dielectric layer 1701 is not used to cover and expose different portions of the wirebond pads 1711a and 1711e, fine feature printing of the compliant dielectric layer 1701 may not be required. Moreover, the compliant dielectric layer 1701 may be printed to avoid an outer ring of wirebond pads and to avoid a central portion of the IC substrate 1707.

As further shown in FIG. 18a, a shadow mask 1809a-b may be aligned on the compliant dielectric layer 1701 and the insulating passivation layer 1703 so that the shadow mask exposes portions of the compliant dielectric layer 1701 and the insulating passivation layer 1703 corresponding to the RDLs. In addition, layers of metal for the RDL may then be deposited on the exposed portions of the wirebond pads 1711a and 1711e, the insulating passivation layer 1703, the compliant dielectric layer 1701, and on the shadow mask 1809a-b, for example, using evaporation, sputtering, and/or chemical vapor deposition. More particularly, portions of the metal layers on the protective layer 1006 may define the RDLs 1709a, 1709e, and 1709i (including bump pads), and excess metal 1709z may be formed on the shadow mask 1809a-b.

More particularly, the shadow mask may include first shadow mask layer 1809a and second shadow mask layer 1809b, and the two shadow mask layers may have different compositions (e.g., comprise different materials and/or concentrations thereof). The two shadow mask layers, for example, may have different concentrations of a chemical amplifier to provide different sensitivities to light. Chemical amplifiers are discussed, for example, in U.S. Pat. No. 5,595,855, the disclosure of which is hereby incorporated herein in its entirety by reference. Accordingly, the two shadow mask layers may develop at different rates and/or the two shadow mask layers may be selectively stripped using different solutions. By providing that the shadow mask layers can be selectively stripped, the second shadow mask 1809b may be removed while maintaining the first shadow mask layer 1809a. By providing the that first shadow mask layer 1809a develops more quickly than the second shadow mask layer 1809b, undercutting of the first shadow mask layer 1809a relative to the second shadow mask layer 1809b (i.e., so that edges of the second shadow mask layer 1809b extend beyond edges of the first shadow mask layer 1809a) may facilitate subsequent stripping of the second shadow mask layer. While not shown in FIG. 18a, portions of the excess metal 1709z may also extend on vertical edges of the second shadow mask layer 1809b.

Each of the shadow mask layers 1809a-b may be applied by spin coating or as a laminate sheet. According to some embodiments of the present invention, solid films of the two different shadow mask layers 1809a-b may be provided together as a laminated sheet that is then applied to the structure including the wirebond pads, the insulating passivation layer, and the compliant dielectric layer. Once applied, the shadow mask layers 1809a-b may be patterned using photolithographic exposure and develop steps.

The metal for the RDLs may include a seed/adhesion layer on the wirebond pads, on the insulating passivation layer, and of the compliant dielectric layer; a conduction layer (such as a layer of copper) on the seed/adhesion layer; a barrier layer (such as a layer of nickel) on the conduction layer; and a passivation layer (such as a layer of gold or an organic solderability preservative) on the barrier layer. The seed/adhesion layer may include a titanium-tungsten (TiW) layer and a copper (Cu) layer on the titanium-tungsten layer. In an alternative, the seed/adhesion layer 1007 may include a layer of aluminum, a layer of nickel vanadium (Ni:V) on the aluminum layer, and a layer of copper on the nickel vanadium layer. In still another alternative, the seed/adhesion layer may include a titanium tungsten (TiW) layer and a nickel layer (Ni) on the titanium-tungsten layer.

As shown in FIG. 18b, the second shadow mask layer 1809b and the excess metal 1709z thereon may be selectively removed/stripped while maintaining the first shadow mask layer 1809a. Stripping of the second shadow mask layer 1809b may be facilitated by providing that the first shadow mask layer 1809a is undercut relative to the second shadow mask layer 1809b so that exposure of the second shadow mask layer 1809b to a stripping solution is increased.

Preformed solder balls 1705a', 1705e', and 1705i' may then be placed on bump pads of the respective RDLs 1709a, 1709e, and 1709i while maintaining the first shadow mask layer 1809a as shown in FIG. 18b. The first shadow mask layer 1809a may thus provide a stencil for placement of the preformed solder balls because the portion of the openings in the first shadow mask layer 1809a over the bump pads (i.e., relatively wide portions of RDLs) are significantly wider than portions of the opening over the narrow portions of RDLs. A solder ball with a diameter greater than a width of the narrow portions of the respective RDL may thus fall selectively into the portion of the opening in the first shadow mask layer 1809a exposing the bump pad of the respective RDL. Accordingly, a single mask alignment (for the shadow mask 1809a-b) may be used both for RDL patterning and for solder ball placement. While preformed solder balls are discussed by way of example, any preformed solder mass having a dimension greater than the relatively narrow portions of the RDL may be used.

The solder balls 1709a', 1709e', and 1709i' can be subjected to a reflow operation while maintaining the first shadow mask layer 1809a, and the first shadow mask layer 1809a can then be removed to provide the solder bumps 1709a, 1709e, and 1709i of FIG. 18c. A difference in widths of relatively wide (i.e., bump pad portions) and relatively narrow portions of the RDLs may be sufficient to reduce flow of solder down narrow portions of the RDLs. In addition, flux may be selectively applied to the bump pad portions of the RDLs (without applying flux to the narrow portions of the RDLs) before placing the preformed solder balls, to further reduce and/or eliminate flow of solder off relatively wide bump pad portions of the RDLs onto narrow portions of the RDLs. By not providing flux on the relatively narrow portions of RDLs, a native oxide on the narrow portions of the RDLs may be maintained during the reflow operation, and a non-wetting characteristic of the native oxide may reduce and/or prevent flow of solder thereon. Flux may be selectively applied, for example, using a flux stamp, printing, etc.

Figure 18D:
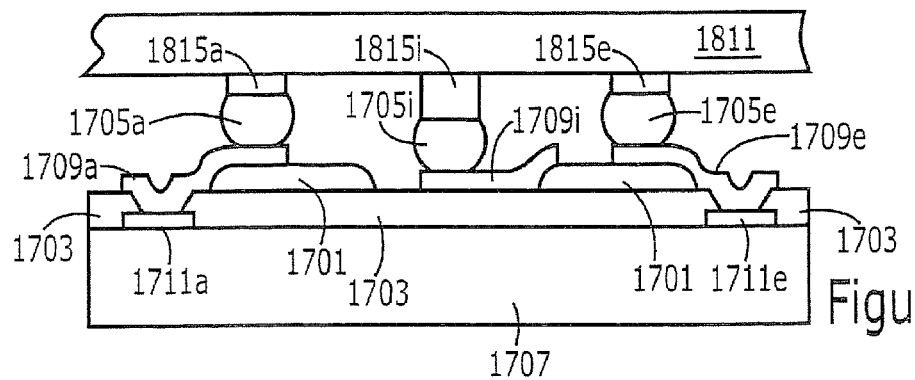

The operations of FIGS. 18a-c may be performed at a wafer level such that the IC substrate 1707 is one of a plurality of IC substrates on a same wafer. Once the solder balls have been subjected to reflow and the first shadow mask layer 1809a has been removed as shown in FIG. 18c, the wafer may be diced to separate the different IC substrates. A individual IC substrate 1707 can then be bonded to another substrate 1811 (such as a printed circuit board) including bump pads 1815a, 1815e, and 1815i using solder bumps 1705a, 1705e, and 1705i, as shown in FIG. 18d.

As the electronic assembly including the IC substrate 1707 and the substrate 1811 is heated and cooled, lateral stresses/strains may be applied to solder bump interconnections therebetween due to differences in thermal expansion of the substrate 1707 and 1811. More particularly, lateral stresses/strains applied to the solder bumps 1705a and 1705e may be greater than lateral stresses/strains applied to the solder bump 1705i because the solder bump 1705i is relatively near a neutral point (NP) of thermal expansion (i.e., having a relatively low DNP) while the solder bumps 1705a and 1705e are relatively distant from the NP. The compliant dielectric layer 1701 may thus absorb lateral stress/strain applied to the solder bumps 1705a and 1705e. In addition or in an alternative, the RDLs 1709a and/or 1709e may detach from the compliant dielectric layer 1701 while maintaining electrical and mechanical connection of the RDLs 1709a and 1709e to the respective wirebond pads 1711a and 1711e so that stresses/strains are absorbed by the respective RDLs. While not shown in FIGS. 17a-b and 18a-d, the RDLs 1709a and 1709e may be curved (as discussed above with respect to FIGS. 15-c and 16a-b) to absorb stress/strain. In contrast, the solder bump 1705i and RDL 1709i may remain securely affixed to the protective insulating layer 1703 so that a rigid mechanical coupling may be maintained between the substrates 1707 and 1811.

As discussed above, the compliant dielectric layer 1701 may be a continuous layer surrounding central portions of the substrate 1707 that are free of the compliant dielectric layer. In an alternative, separate islands of the compliant dielectric layer may be provided for different ones of the solder bumps 1705a-h and/or RDLs 1709a-h. Accordingly, the RDL 1709i may traverse between the wirebond pad 1709i and solder bump 1705i without crossing the compliant dielectric layer. In still other alternatives, the wirebond pad 1711i corresponding to the solder bump 1705i may be provided on the central portion of the substrate 1707 that is surrounded by the compliant dielectric layer 1701, and if the solder bump 1705i is aligned on the respective wirebond pad, an RDL providing lateral connection between the two may not be required.

As discussed above with reference to FIGS. 10a-e, 11a-e, and 18a-d, multilayer masks may be used to form redistribution lines (RDLs) and/or bump pads according to embodiments of the present invention. Use of such multilayer masks will be discussed in greater detail below with respect to FIGS. 20a-f, 21a-e, 22, and 23.

Figure 20A:
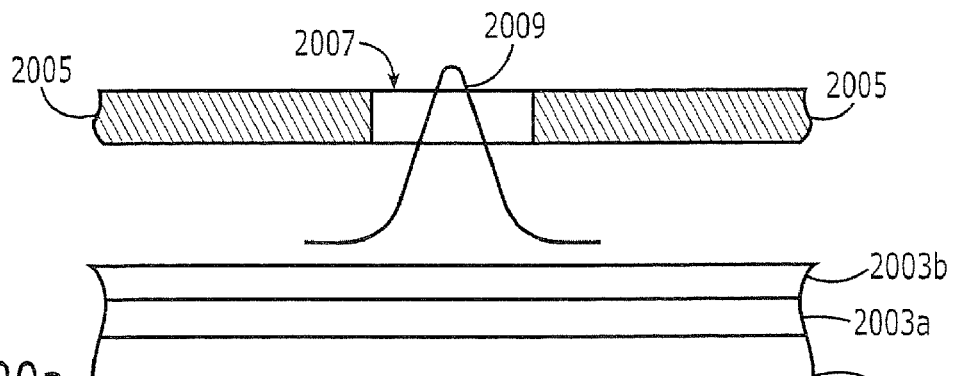
FIGS. 20a-f, 21a-e, 22, and 23 are cross-sectional views illustrating methods of forming two layer lift-off patterns according to embodiments of the present invention.

A process flow according to more embodiments of the present invention is discussed below with respect to the cross sectional views of FIGS. 20a-f. As shown in FIG. 20a, an electronic device (such as an integrated circuit semiconductor device) may include a substrate 2001 (such as a semiconductor substrate). While not shown in FIG. 20a, the substrate 2001 may include a wirebond pad (also referred to as an input/output pad), and/or an insulating passivation layer (as discussed above, for example, with respect to FIGS. 10a-e, 11a-e, and/or 18a-d). Moreover, a protective layer (such as a blanket layer of polyimide) may be provided on the substrate 2001 and/or portions thereof, and the protective layer may be patterned to expose portions of a wirebond pad of the substrate 2001. Such a protective layer may also be patterned to expose portions of dicing streets between integrated circuit devices on a manufacturing wafer.

As further shown in FIG. 20a, first and second photo-sensitive layers 2003a and 2003b (also referred to as photo-resist layers) of different composition may be formed on the substrate 2001, and the first and second photo-sensitive layers 2003a and 2003b may have different photo-sensitivities (i.e., different photo-speeds) and/or different developing speeds. Moreover, a patterning mask 2005 may be aligned with the substrate 2001 to selectively expose portions of the first and second photo-sensitive layers 2003a-b to radiation (such as light) through an opening(s) 2007 in the mask 2005. Because an intensity of radiation passing through the opening 2007 may have a Gaussian profile 2009, dimensions of a pattern(s) formed in the first and second photo-sensitive layers 2003a-b may depend on photo-sensitivities of the respective layers 2003a-b.

Each of the photo-sensitive layers 2003a-b may be applied by spin coating and/or as a laminate sheet. According to some embodiments of the present invention, solid films of the two different photo-sensitive layers 2003a-b may be provided together as a laminated sheet that is then applied to the substrate 2001. If spin coating is used for the photo-sensitive layers 2003a-b, different solvent systems (e.g., aqueous and non-aqueous solvents, or organic and inorganic solvents) may be used for the photo-sensitive layers. By using different solvent systems when spin coating the photo-sensitive layers 2003a-b and/or by applying one or both of the photo-sensitive layers 2003a-b as a solid sheet, mixing of the two photo-sensitive layers 2003a-b may be reduced to provide an improved undercut step as discussed with respect to FIG. 20b. Once applied to the substrate 2001, the photo-sensitive layers 2003a-b may be patterned using photolithographic exposure and develop steps.

Figure 20B:
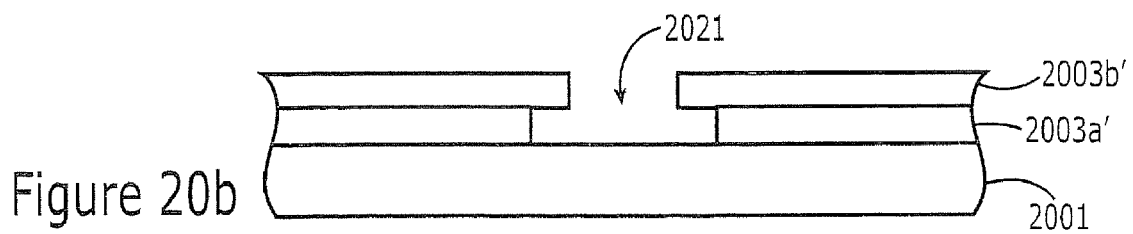

After exposure to radiation through the mask 2005, the photo-sensitive layers 2003a-b may be developed to provide the patterned layers 2003a' and 2003b' having an opening 221 exposing portions of the substrate 2001 as shown in FIG. 20b. In FIGS. 20a and 20b, positive photo-sensitive layers 2003a-b may be used so that portions thereof that are exposed to radiation may be removed by developing. With positive photo-sensitive layers 2003a-b, the first photo-sensitive layer 2003a may have a higher photo-sensitivity than the second photo-sensitive layer 2003b, and/or the first photo-sensitive layer 2003a may have a higher developing speed than the second photo-sensitive layer 2003b. Accordingly, the first pattern layer 2003a' may be undercut relative to the second patterned layer 2003b'. The two photo-sensitive layers 2003a and 2003b, for example, may have different concentrations of a chemical amplifier to provide different sensitivities to light. Chemical amplifiers are discussed, for example, in U.S. Pat. No. 5,595,855, the disclosure of which is hereby incorporated herein in its entirety by reference. Accordingly, the two photo-sensitive layers 2003a and 2003b may develop at different rates and/or the two photo-sensitive layers may be selectively stripped using different solutions. By providing that the photo-sensitive layers can be selectively stripped, the second patterned layer 2003b' may be removed while maintaining the first patterned layer 2003a'.

Figure 20C:
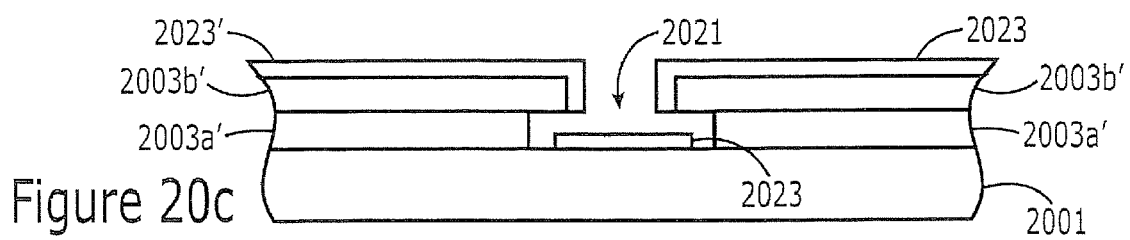

The patterned layers 2003a' and 2003b' may together provide a shadow mask used to form a metal layer on the exposed portion of the substrate 2002. More particularly, a metal layer 2023 may be sputtered on the second patterned layer 2003b' and on exposed portions of the substrate 2001 as shown in FIG. 20c. As further shown in FIG. 20c, portions of the metal layer 2023 may be formed on sidewalls of the second patterned layer 2003b' adjacent the opening 2021, while sidewalls of the first patterned layer 2003a' adjacent the opening 2021 and undercut portions of the second patterned layer 2003b' may be free of the metal layer 2023. Accordingly, one or both of the patterned layers 2003a' and 2003b' may be more easily removed using a wet strip because portions thereof are free of the metal layer 2023. While the metal layer 2023 may be formed using methods other than sputtering (such as evaporation, chemical vapor deposition, etc.), sputtering may provide a faster and/or cheaper deposition, and/or sputtering may provide improved adhesion.

The metal layer 2023 may include an adhesion layer (such as a layer of titanium-tungsten TiW) on the substrate 2001 and a conduction layer (such as a layer of copper Cu) on the adhesion layer. In an alternative, the metal layer 2001 may include a layer of aluminum on the substrate 2001, a layer of nickel vanadium (Ni:V) on the aluminum layer, and/or a layer of copper on the nickel vanadium layer. In still another alternative, the metal layer 2001 may include a titanium tungsten (TiW) layer on the substrate 2001 and a nickel layer (Ni) on the titanium tungsten layer.

Figure 20D:
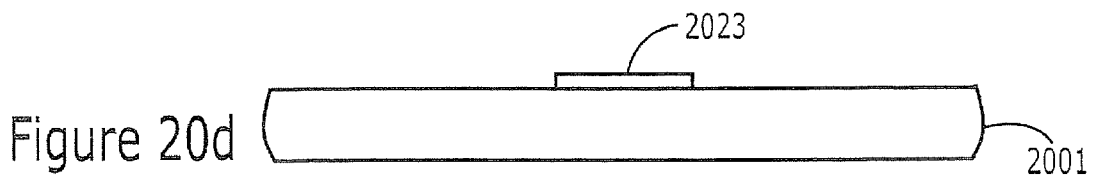

As shown in FIG. 20d, the first and second patterned layers 2003a' and 2003b' and portions of the metal layer 2023 thereon may be selectively removed/stripped while maintaining portions of the metal layer 2023 on the substrate 2001. Stripping of the patterned layers 2003a' and 2003b' may be facilitated by providing that the first patterned layer 2003a' is undercut relative to the second patterned layer 2003b' so that exposure of portions the first and second patterned layers 2003a' and 2003b' to a stripping solution is increased.

Figure 20E:
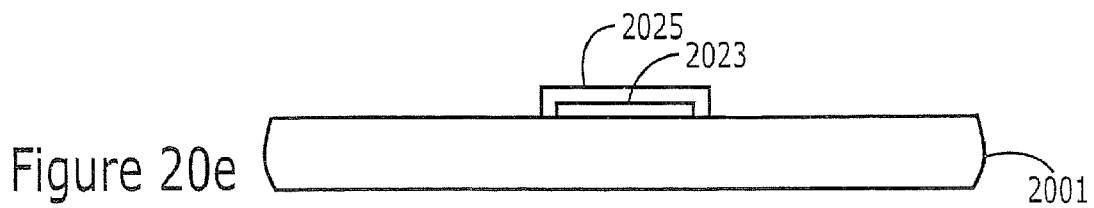

As shown in FIG. 20e, a second metal layer 2025 may be plated on the first metal layer 2023. More particularly, the second metal layer 2025 may be plated using a catalytic/autocatalytic process and/or a substitutional process (such as an immersion process). For example, the second metal layer 2025 may be plated using electroless-nickel/immersion-gold (ENIG). The second metal layer 2025 may include a conduction layer (such as a layer of copper) on the first metal layer 2023, a barrier layer (such as a layer nickel) on the conduction layer, and a conductive passivation layer (such as a layer of gold) on the barrier layer. In an alternative, an organic solderability preservative may be provided as a passivation layer (instead of gold). The passivation layer may be provided to protect against oxidation of the second metal layer 2025. Moreover, compositions of the metal layer 2025 other than those discussed above may be used. For example, a conductive passivation layer may be omitted or a material other than gold may be provided as a conductive passivation layer.

Figure 20F:
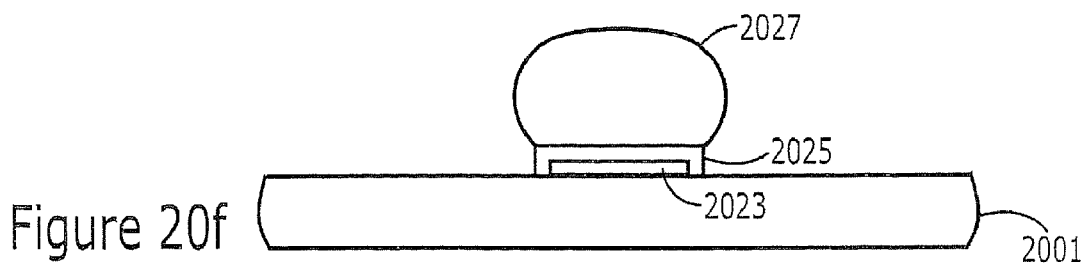

A preformed solder ball may then be placed on the second metal layer 2025 and subjected to a reflow operation to provide a solder bump 2027 as shown in FIG. 20f. Accordingly, the metal layers 2023 and 2025 may provide a bump pad for electrical and mechanical connection to another substrate using solder bump 2027. While not shown in FIGS. 20a-20f a relatively narrow portion of the metal layers 2023 and 2025 may provide a redistribution line (RDL) between the bump pad and an input/output pad of the substrate 2001 as discussed above, for example, with respect to FIGS. 10a-e and 11a-e. In alternative embodiments, the metal layers 2023 and 2025 may provide a bump pad directly on an input/output pad of the substrate 2001.

Figure 22:
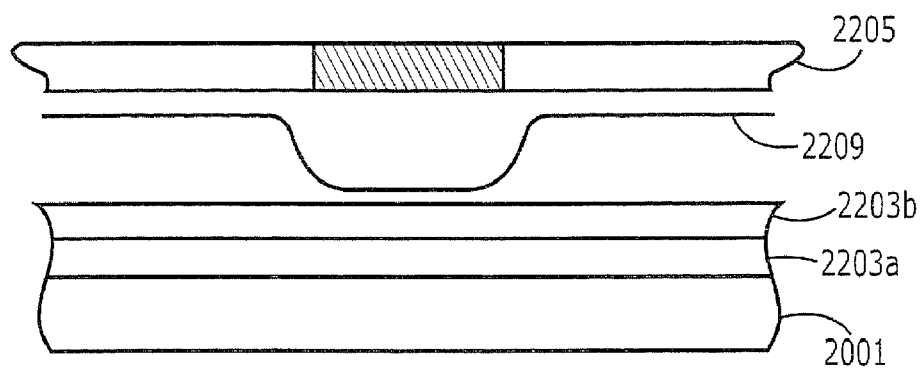

In an alternative, the first and second patterned layers 2003a' and 2003b' of FIG. 20b may be provided using negative photo-sensitive layers 2203a and 2203b as discussed below with respect to FIG. 22. For example, negative photo-sensitive layers 2203a-b may be used so that portions thereof that are not exposed to radiation may be removed by developing. With negative photo-sensitive layers 2203a-b, the first photo-sensitive layer 2203a may have a lower photo-sensitivity that the second photo-sensitive layer 2203b, and/or the first photo-sensitive layer 2203a may have a lower developing speed that the second photo-sensitive layer 2203b. Accordingly, the first pattern layer 2003a' may be undercut relative to the second patterned layer 2003b'. The two negative photo-sensitive layers 2203a and 2203b, for example, may have different concentrations of a chemical amplifier to provide different sensitivities to light. By selectively exposing the negative photo-sensitive layers 2203a-b to radiation using the mask 2205 (which is a reverse image of the mask 2005) to provide radiation intensity profile 2209 and developing the photo-sensitive layers 2203a-b, the patterned layers 2003a' and 2003b' of FIG. 20b may be provided.

Figure 21A:
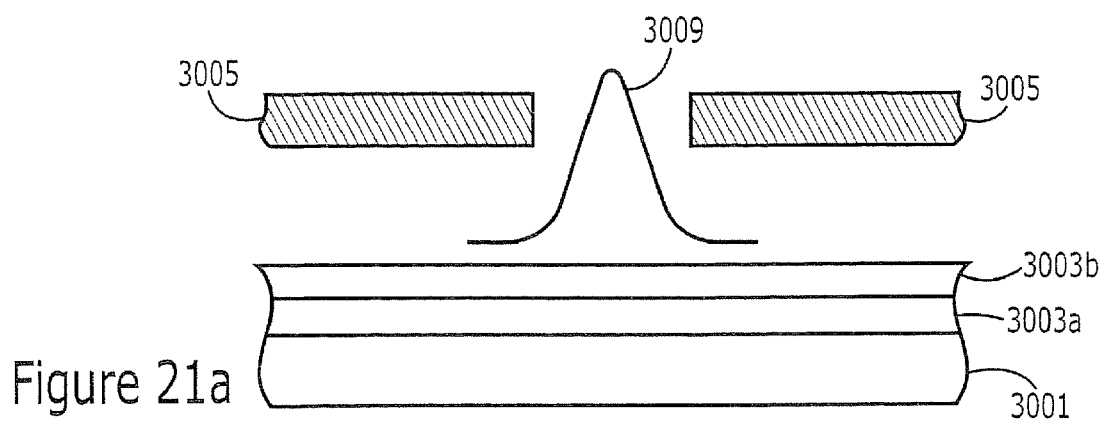

A process flow according to more embodiments of the present invention is discussed below with respect to the cross sectional views of FIGS. 21a-e. As shown in FIG. 21a, an electronic device (such as an integrated circuit semiconductor device) may include a substrate 3001 (such as a semiconductor substrate). While not shown in FIG. 21a, the substrate 3001 may include a wirebond pad (also referred to as an input/output pad), and/or an insulating passivation layer (as discussed above, for example, with respect to FIGS. 10a-e, 11a-e, and/or 18a-d). Moreover, a protective layer (such as a blanket layer of polyimide) may be provided on the substrate 3001 and/or portions thereof, and the protective layer may be patterned to expose portions of a wirebond pad of the substrate 3001. Such a protective layer may also be patterned to expose portions of dicing streets between integrated circuit devices on a manufacturing wafer.

As further shown in FIG. 21a, first and second photo-sensitive layers 3003a and 3003b (also referred to as photo-resist layers) of different composition may be formed on the substrate 3001, and the first and second photo-sensitive layers 3003a and 3003b may have different photo-sensitivities (i.e., different photo-speeds) and/or different developing speeds. Moreover, a patterning mask 3005 may be aligned with the substrate 3001 to selectively expose portions of the first and second photo-sensitive layers 3003a-b to radiation (such as light) through an opening(s) 3007 in the mask 3005. Because an intensity of radiation passing through the opening 3007 may have a Gaussian profile 3009, dimensions of a pattern(s) formed in the first and second photo-sensitive layers 3003a-b may depend on photo-sensitivities of the respective layers 3003a-b.

Each of the photo-sensitive layers 3003a-b may be applied by spin coating and/or as a laminate sheet. According to some embodiments of the present invention, solid films of the two different photo-sensitive layers 3003a-b may be provided together as a laminated sheet that is then applied to the substrate 3001. If spin coating is used for the photo-sensitive layers 3003a-b, different solvent systems (e.g., aqueous and non-aqueous solvents, or organic and inorganic solvents) may be used for the photo-sensitive layers. By using different solvent systems when spin coating the photo-sensitive layers 3003a-b and/or by applying one or both of the photo-sensitive layers 3003a-b as a solid sheet, mixing of the two photo-sensitive layers 3003a-b may be reduced to provide an improved undercut step as discussed with respect to FIG. 21b. Once applied to the substrate 3001, the photo-sensitive layers 3003a-b may be patterned using photolithographic exposure and develop steps.

After exposure to radiation through the mask 3005, the photo-sensitive layers 3003a-b may be developed to provide the patterned layers 3003a' and 3003b' having an opening 3021 exposing portions of the substrate 3001 as shown in FIG. 20b. In FIGS. 20a and 20b, positive photo-sensitive layers 3003a-b may be used so that portions thereof that are exposed to radiation may be removed by developing. With positive photo-sensitive layers 3003a-b, the first photo-sensitive layer 3003a may have a higher photo-sensitivity than the second photo-sensitive layer 3003b, and/or the first photo-sensitive layer 3003a may have a higher developing speed than the second photo-sensitive layer 3003b. Accordingly, the first pattern layer 3003a' may be undercut relative to the second patterned layer 3003b'. The two photo-sensitive layers 3003a and 3003b, for example, may have different concentrations of a chemical amplifier to provide different sensitivities to light. Chemical amplifiers are discussed, for example, in U.S. Pat. No. 5,595,855, the disclosure of which is hereby incorporated herein in its entirety by reference. Accordingly, the two photo-sensitive layers 3003a and 3003b may develop at different rates and/or the two photo-sensitive layers may be selectively stripped using different solutions. By providing that the photo-sensitive layers can be selectively stripped, the second patterned layer 3003b' may be removed while maintaining the first patterned layer 3003a'. According to some embodiments of the present invention, the first photo-sensitive layer 3003a may be a photo-imageable epoxy.

The patterned layers 3003a' and 3003b' may together provide a shadow mask used to form a metal layer on the exposed portion of the substrate 3002. More particularly, a metal layer 3023 may be sputtered on the second patterned layer 3003b' and on exposed portions of the substrate 3001 as shown in FIG. 20c. As further shown in FIG. 20c, portions of the metal layer 3023 may be formed on sidewalls of the second patterned layer 3003b' adjacent the opening 3021, while sidewalls of the first patterned layer 3003a' adjacent the opening 3021 and undercut portions of the second patterned layer 3003b' may be free of the metal layer 3023. Accordingly, one or both of the patterned layers 3003a' and 3003b' may be more easily removed using a wet strip because portions thereof are free of the metal layer 3023. While the metal layer 3023 may be formed using methods other than sputtering (such as evaporation, chemical vapor deposition, etc.), sputtering may provide a faster and/or cheaper deposition, and/or sputtering may provide improved adhesion.

The metal layer 3023 may include an adhesion layer (such as a layer of titanium-tungsten TiW) on the substrate 3001 and a conduction layer (such as a layer of copper Cu) on the adhesion layer. In an alternative, the metal layer 3001 may include a layer of aluminum on the substrate 3001, a layer of nickel vanadium (Ni:V) on the aluminum layer, and/or a layer of copper on the nickel vanadium layer. In still another alternative, the metal layer 3001 may include a titanium tungsten (TiW) layer on the substrate 3001 and a nickel layer (Ni) on the titanium tungsten layer.

Figure 21B:
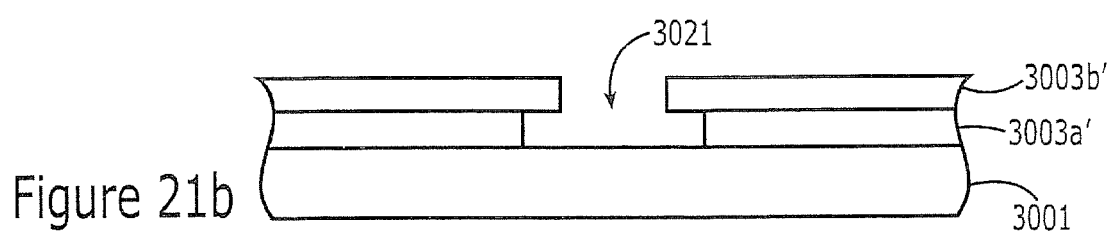
Figure 21C:
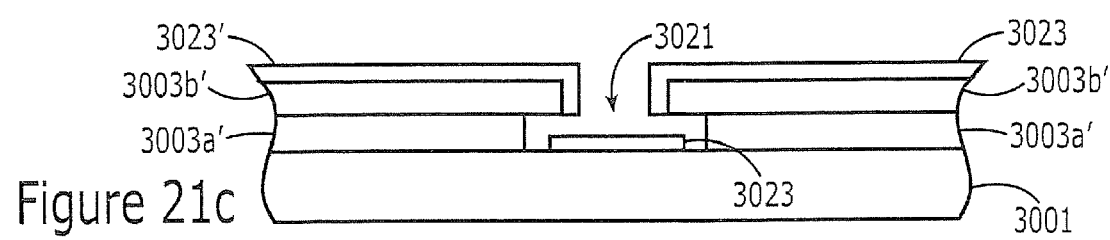
Figure 21D:
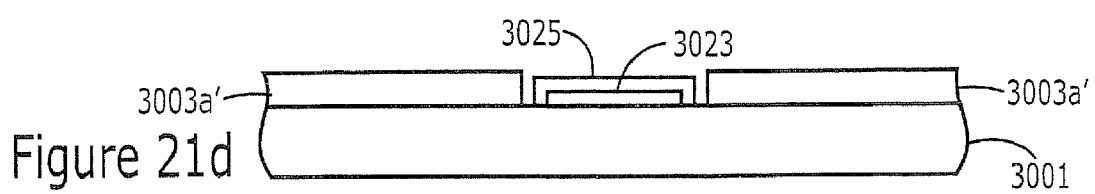

As shown in FIG. 21d, the second patterned layer 3003b' and portions of the metal layer 3023 thereon may be selectively removed/stripped while maintaining the first patterned layer 3003a' and portions of the metal layer 3023 on the substrate 3001. Stripping of the second patterned layer 3003b' may be facilitated by providing that the first patterned layer 3003a' is undercut relative to the second patterned layer 3003b' so that exposure of portions the second patterned layer 3003b' to a stripping solution is increased. As discussed above, the first and second patterned layers 3003a' and 3003b' may have different compositions such that a stripping agent used to remove the second patterned layer 3003b' is selective with respect to the second patterned layer 3003b' relative to the first patterned layer 3003a'. According to some embodiments of the present invention, the first patterned layer 3003a' may be a photo-imageable epoxy.

After removing the second patterned layer 3003b' and portions of the first metal layer 3023 thereon, a second metal layer 3025 may be plated on the first metal layer 3023 while continuing to maintain the first patterned layer 3003a' on the substrate 3001. More particularly, the second metal layer 3025 may be plated using a catalytic/autocatalytic process and/or a substitutional process (such as an immersion process). For example, the second metal layer 3025 may be plated using electroless-nickel/immersion-gold (ENIG). The second metal layer 3025 may include a conduction layer (such as a layer of copper) on the first metal layer 3023, a barrier layer (such as a layer nickel) on the conduction layer, and a conductive passivation layer (such as a layer of gold) on the barrier layer. In an alternative, an organic solderability preservative may be provided as a passivation layer (instead of gold). The passivation layer may be provided to protect against oxidation of the second metal layer 3025. Moreover, compositions of the metal layer 3025 other than those discussed above may be used. For example, a conductive passivation layer may be omitted or a material other than gold may be provided as a conductive passivation layer.

Figure 21E:
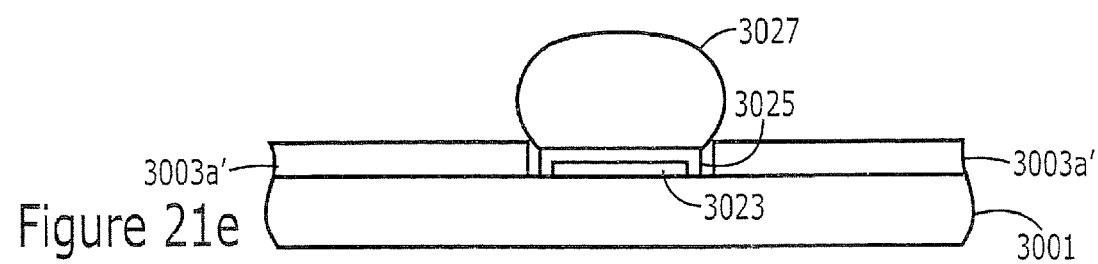

A preformed solder ball may then be placed on the second metal layer 3025 and subjected to a reflow operation to provide a solder bump 3027 as shown in FIG. 21e. Accordingly, the metal layers 3023 and 3025 may provide a bump pad for electrical and mechanical connection to another substrate using solder bump 3027. While not shown in FIGS. 21a-21e a relatively narrow portion of the metal layers 3023 and 3025 may provide a redistribution line (RDL) between the bump pad and an input/output pad of the substrate 3001 as discussed above, for example, with respect to FIGS. 10a-e and 11a-e. In alternative embodiments, the metal layers 3023 and 3025 may provide a bump pad directly on an input/output pad of the substrate 3001.

As shown in FIGS. 21d and 21e, the bump pad provided by the metal layers 3023 and 3025 may be recessed relative to the first patterned layer 3003a' according to some embodiments of the present invention. Accordingly, the first patterned layer 2003a' may provide a stencil for placement of a pre-formed solder mass used to form the solder bump 3027 to assist in placement of the solder mass before reflow. If relatively narrow portions of the metal layers 3023 and 3025 provide an RDL (not shown) and relatively wide portions of the metal layers 3023 and 3025 provide the bump pad for the solder bump 3027, a portion of the opening in the first patterned layer 2003a' extending beyond the metal layers 3023 and 3025 may be significantly wider than the portion of the opening over the RDL 1011. A solder ball or mass with a diameter greater than a width of the RDL may thus fall selectively into the portion of the opening in the first patterned layer 3003a' exposing the bump pad portion of the metal layers 3023 and 3025.

Accordingly, a single mask alignment (for the patterned layers 3003a' and 3003b') may be used to pattern the metal layers 3023 and 3025 (providing both an RDL and a bump pad) and for placement of a solder mass or ball used to form solder bump 3027. As used herein, the term RDL may be defined to include both a relatively narrow RDL and a relatively wide bump pad. While a preformed solder ball is discussed by way of example, any preformed solder mass having a dimension greater than a width of a relatively narrow RDL may be used. Use of patterned layers for placement of a solder mass/ball is discussed above with respect to FIGS. 10a-e, 11a-e, and 18a-d.

According to other embodiments of the present invention, surfaces of the second metal layer 3025 and the first patterned layer 3003a' opposite the substrate may be substantially even. For example, a combined thickness of the metal layers 3023 and 3025 may be substantially equal to a thickness of the first patterned layer 3003a'. According to still other embodiments of the present invention, a surface of the metal layer 3025 opposite the substrate may extend beyond a surface of the first patterned layer 3003a'. For example, a combined thickness of the metal layers 3023 and 3025 may be greater than a thickness of the first patterned layer 3003a'.

After placement, the solder ball/mass can be subjected to a reflow operation to form the solder bump 3027, and the first patterned layer 3003a' can be maintained after reflow as shown in FIG. 21e according to some embodiments of the present invention. Moreover, the first patterned layer 3003a' can be maintained after bonding the substrate 3001 to another substrate using the solder bump 3027. According to some other embodiments of the present invention, the first patterned layer 3003a' may be removed after forming the solder bump 3027.

If the metal layers 3023 and 3025 define both a relatively narrow RDL and a relatively wide bump pad, a difference in widths of the bump pad and the RDL may be sufficient to reduce flow of solder down the RDL. In addition, flux may be selectively applied to the bump pad portion of metal layer 3025 (without applying flux to the RDL or portions thereof) before placing the preformed solder ball/mass thereon, to further reduce and/or eliminate flow of solder onto the RDL. By not providing flux on the RDL, a native oxide on the RDL may be maintained during the reflow operation, and a non-wetting characteristic of the native oxide may reduce and/or prevent flow of solder thereon. Flux may be selectively applied to the bump pad portion of metal layer 3025, for example, using a flux stamp, printing, etc. According to other embodiments of the present invention, a solder mass may be provided, for example, using a screen printed solder paste, using a printed solder, using a jetted solder, using evaporated solder, a plated solder, etc. A reflow operation may then be used provide a rounded solder bump and/or to flow solder from an RDL portion of metal layer 3025 to a bump pad portion of metal layer 3025.

Figure 23:
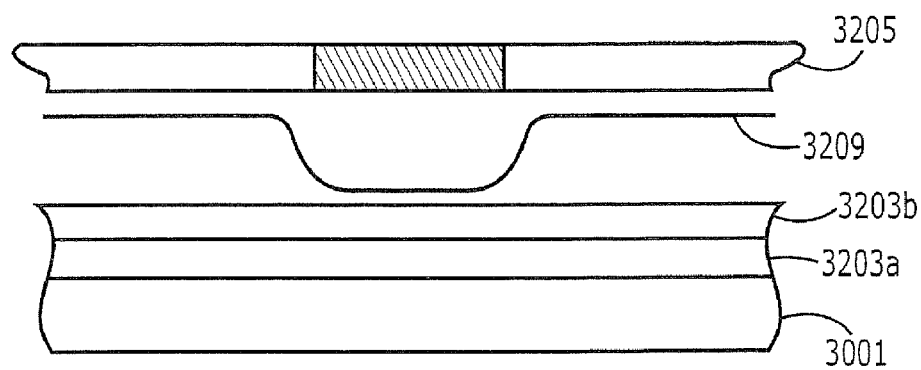

In an alternative, the first and second patterned layers 3003a' and 3003b' of FIG. 21b may be provided using negative photo-sensitive layers 3203a and 3203b as discussed below with respect to FIG. 23. For example, negative photo-sensitive layers 3203a-b may be used so that portions thereof that are not exposed to radiation may be removed by developing. With negative photo-sensitive layers 3203a-b, the first photo-sensitive layer 3203a may have a lower photo-sensitivity than the second photo-sensitive layer 3203b, and/or the first photo-sensitive layer 3203a may have a lower developing speed that the second photo-sensitive layer 3203b. Accordingly, the first pattern layer 3003a' may be undercut relative to the second patterned layer 3003b'. The two negative photo-sensitive layers 3203a and 3203b, for example, may have different concentrations of a chemical amplifier to provide different sensitivities to light. By selectively exposing the negative photo-sensitive layers 3203a-b to radiation using the mask 3205 (which is a reverse image of the mask 3005) to provide radiation intensity profile 3209 and developing the photo-sensitive layers 3203a-b, the patterned layers 3003a' and 3003b' of FIG. 21b may be provided.

According to still additional embodiments of the present invention, an epoxy passivation layer may be provided on otherwise exposed RDL. As shown in FIGS. 2g, 3g, 4h, 5h, 6e, 7e, 8d, 9d, 10e, 11e, 12h, and 13h, for example, a relatively narrow RDL and a relatively wide bump pad may be provided using a patterned metal layer(s), and a solder bump may be provided on the bump pad. As further shown in FIGS. 2g, 3g, 4h, 5h, 6e, 7e, 8d, 9d, 10e, 11e, 12h, and 13h, the RDL may remain exposed after reflowing the solder. According to other embodiments of the present invention, an epoxy passivation layer may be formed on the RDL and other portions of the substrate without requiring an additional photo-masking step.

For example, an uncured epoxy layer may be provided across the substrate and the RDL and the bump pad before placing a preformed solder ball/mass on the bump pad. Moreover, the epoxy layer may cure at a temperature greater than a reflow temperature of the solder ball/mass. Accordingly, a heating operation(s) can be used to reflow the solder ball/mass at a first reflow temperature and then to cure the epoxy at a second curing temperature that is greater than the reflow temperature. By providing that the uncured epoxy has a relatively low viscosity, the solder ball/mass may wet to the bump pad during reflow. Moreover, the uncured epoxy layer may have a viscosity that decreases with increasing temperatures at and below the reflow temperature of the solder ball/mass so that the solder ball/mass may more easily wet to the bump pad. According to some embodiments of the present invention, a cure temperature of the epoxy may be less than and/or equal to a reflow temperature of the solder ball/mass. Because the epoxy may cure slowly relative to reflow of the solder, the solder may wet to the pad without significant interference from the epoxy. According to still other embodiments of the present invention, epoxy can be applied after reflow and then cured. By applying a relatively thin layer of epoxy, the solder bumps may extend through the cured epoxy layer.

According to additional embodiments of the present invention, a low surface tension flux may be selectively provided (for example, by printing, stamp placement, etc.) on the bump pad before providing the uncured epoxy layer so that the bump pad is free of the uncured epoxy layer when the preformed solder ball/mass is placed thereon. Moreover, the flux may be selectively provided by printing, stamp placement, etc. so that a photo-mask step is not required to provide the flux.

The epoxy passivation layer may thus be coated on a wafer including a plurality of integrated circuit devices before dicing the wafer. By providing the epoxy layer in dicing streets of the wafer, chip-outs due to dicing can be reduced. For example, an epoxy layer having a cured thickness of at least about 30 micrometers (and more particularly of at least about 40 micrometers) in the dicing streets may reduce chip-outs during dicing.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A method of forming an interconnection for an electronic device including a substrate, the method comprising:
    forming first and second patterned layers on the substrate wherein an opening in the first and second patterned layers exposes portions of the substrate, wherein the first and second patterned layers have different compositions, and wherein the first patterned layer is between the second patterned layer and the substrate;
    forming a metal layer on the second patterned layer and on portions of the substrate exposed through the opening in the first and second patterned layers;
    removing the second patterned layer and portions of the metal layer thereon while maintaining portions of the metal layer on the portions of the substrate exposed through the opening; and
    after removing the second patterned layer, providing solder on the metal layer.

2. A method according to claim 1 wherein providing the solder on the metal layer comprises providing a preformed solder mass on the metal layer while maintaining the first patterned layer after removing the second patterned layer, and after providing the preformed solder mass, bonding the preformed solder mass to the metal layer.

3. A method according to claim 1 wherein the metal layer comprises a first metal layer, the method further comprising:
after removing the second patterned layer and before providing the solder, selectively forming a second metal layer on the first metal layer so that the second metal layer is between the solder and the first metal layer.

4. A method according to claim 3 wherein selectively forming the second metal layer comprises plating the second metal layer.

5. A method according to claim 1 wherein forming the metal layer comprises sputtering the metal layer.

6. A method according to claim 1 wherein providing solder on the metal layer comprises providing solder on the metal layer while maintaining the first patterned layer.

7. A method according to claim 6 wherein the first patterned layer comprises a photo-imageable epoxy.

8. A method according to claim 1 wherein forming the first and second patterned layers comprises,
forming first and second photo-sensitive layers on the substrate,
selectively exposing the first and second photo-sensitive layers to radiation using a photo-mask, and
after forming the first and second photo-sensitive layers and after selectively exposing the first and second photo-sensitive layer, developing the first and second photo-sensitive layers.

9. A method according to claim 8 wherein forming the first and second photo-sensitive layers comprises coating the first and second photo-sensitive layers using different solvents for the first and second photo-sensitive layers.

10. A method according to claim 8 wherein the first photo-sensitive layer has a first photo-sensitivity, wherein the second photo-sensitive layer has a second photo-sensitivity, and wherein the first and second photo-sensitivities are different.

11. A method according to claim 1 wherein forming the first and second patterned layers comprises providing the first and second patterned layers as a pre-laminated dry film, and then applying the pre-laminated dry film to the substrate.

12. A method of forming an interconnection for an electronic device including a substrate, the method comprising:
forming first and second patterned layers on the substrate wherein an opening in the first and second patterned layers exposes portions of the substrate, wherein the first and second patterned layers have different compositions, and wherein the first patterned layer is between the second patterned layer and the substrate;
forming a metal layer on the second patterned layer and on portions of the substrate exposed through the opening in the first and second patterned layers; and
removing the second patterned layer and portions of the metal layer thereon while maintaining the first patterned layer and portions of the metal layer on the portions of the substrate exposed through the opening wherein the metal layer is spaced apart from the first patterned layer.

13. A method according to claim 12 wherein the metal layer comprises a first metal layer, the method further comprising:
after removing the second patterned layer, selectively forming a second metal layer on the first metal layer.

14. A method according to claim 13 wherein selectively forming the second metal layer comprises selectively forming the second metal layer while maintaining the first patterned layer.

15. A method according to claim 14 wherein the first patterned layer comprises a photo-imageable epoxy.

16. A method according to claim 13 further comprising:
after selectively forming the second metal layer, providing solder on the second metal layer.

17. A method according to claim 16 wherein providing solder comprises providing a preformed solder mass on the second metal layer while maintaining the first patterned layer, and after providing the preformed solder mass, bonding the preformed solder mass to the second metal layer.

18. A method according to claim 13 wherein selectively forming the second metal layer comprises plating the second metal layer.

19. A method according to claim 12 wherein forming the metal layer comprises sputtering the first metal layer.

20. A method according to claim 12 wherein forming the first and second patterned layers comprises,
forming first and second photo-sensitive layers on the substrate,
selectively exposing the first and second photo-sensitive layers to radiation using a photo-mask, and
after forming the first and second photo-sensitive layers and after selectively exposing the first and second photo-sensitive layer, developing the first and second photo-sensitive layers.

21. A method according to claim 20 wherein forming the first and second photo-sensitive layers comprises coating the first and second photo-sensitive layers using different solvents for the first and second photo-sensitive layers.

22. A method according to claim 20 wherein the first photo-sensitive layer has a first photo-sensitivity, wherein the second photo-sensitive layer has a second photo-sensitivity, and wherein the first and second photo-sensitivities are different.

23. A method according to claim 12 wherein forming the first and second patterned layers comprises providing the first and second patterned layers as a pre-laminated dry film, and then applying the pre-laminated dry film to the substrate.

24. A method according to claim 12 wherein portions of the substrate are exposed between the metal layer and the first patterned layer.

25. A method according to claim 1 wherein the metal layer is spaced apart from the first patterned layer.

26. A method according to claim 25 wherein portions of the substrate are exposed between the metal layer and the first patterned layer.

27. A method according to claim 1 further comprising:
after providing the solder on the metal layer, reflowing the solder.

28. A method according to claim 16 further comprising:
after providing the solder on the second metal layer, reflowing the solder.

29. A method according to claim 1 wherein portions of the first patterned layer adjacent the opening are undercut relative to the second patterned layer.

30. A method according to claim 12 wherein portions of the first patterned layer adjacent the opening are undercut relative to the second patterned layer.

* * * * *